United States Patent
Lin et al.

(10) Patent No.: US 10,685,711 B1
(45) Date of Patent: Jun. 16, 2020

(54) DECODING METHOD, MEMORY CONTROLLING CIRCUIT UNIT AND MEMORY STORAGE DEVICE

(71) Applicant: PHISON ELECTRONICS CORP., Miaoli (TW)

(72) Inventors: Wei Lin, Taipei (TW); Lih Yuarn Ou, Taoyuan (TW); Yu-Siang Yang, New Taipei (TW)

(73) Assignee: PHISON ELECTRONICS CORP., Miaoli (TW)

(*) Notice: Subject to any disclaimer, the term of this patent is extended or adjusted under 35 U.S.C. 154(b) by 0 days.

(21) Appl. No.: 16/276,634

(22) Filed: Feb. 15, 2019

(30) Foreign Application Priority Data

Dec. 25, 2018 (TW) .............................. 107146953 A

(51) Int. Cl.
```
G06F 3/06       (2006.01)
G11C 16/08      (2006.01)
G11C 16/26      (2006.01)
G11C 16/10      (2006.01)
G11C 16/14      (2006.01)
G11C 11/56      (2006.01)
G11C 16/04      (2006.01)
G11C 16/24      (2006.01)
```
(52) U.S. Cl.
CPC ............ G11C 16/08 (2013.01); G06F 3/0604 (2013.01); G06F 3/0652 (2013.01); G06F 3/0659 (2013.01); G06F 3/0679 (2013.01); G11C 16/10 (2013.01); G11C 16/14 (2013.01); *G11C 16/26* (2013.01); *G11C 11/5671* (2013.01); *G11C 16/0483* (2013.01); *G11C 16/24* (2013.01)

(58) Field of Classification Search
None
See application file for complete search history.

(56) References Cited

U.S. PATENT DOCUMENTS

2017/0271031 A1   9/2017   Sharon et al.

OTHER PUBLICATIONS

"Office Action of Taiwan Counterpart Application", dated Jul. 9, 2019, pp. 1-12.

*Primary Examiner* — Kevin Verbrugge
(74) *Attorney, Agent, or Firm* — JCIPRNET

(57) ABSTRACT

A decoding method, a memory controlling circuit unit, and a memory storage device are provided. The method includes: receiving a read command for reading first data; obtaining a current first temperature of a rewritable non-volatile memory module according to the read command; obtaining a second temperature of the rewritable non-volatile memory module of writing the first data to a first physical programming unit according to the read command; and selecting a first decoding operation according to the first temperature and the second temperature and executing the first decoding operation.

34 Claims, 14 Drawing Sheets

| Lower physical programming unit | Middle physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

| Temperature interval | Temperature | | Identification code |
|---|---|---|---|
| | Lower boundary(°C) | Upper boundary(-°C) | |
| A0 | – | −25 | 000 |
| A1 | −25 | 0 | 001 |
| A2 | 0 | 25 | 010 |
| A3 | 25 | 40 | 011 |
| A4 | 40 | 60 | 100 |
| A5 | 60 | 80 | 101 |
| A6 | 80 | 100 | 110 |
| A7 | 100 | – | 111 |

| Replica | B0 | B1 | B2 | B3 | B4 |
|---|---|---|---|---|---|
| Identification code | 010 | 010 | 011 | 010 | 010 |
| Correctness | V | V | | | V |

| Write temperature | Read temperature | Read voltage group |
|---|---|---|
| 000 | 000 | G0 |
| 001 | 000 | G0 |
| 010 | 000 | G0 |
| 011 | 000 | G0 |
| ⋮ | ⋮ | ⋮ |
| 000 | 001 | G1 |
| 001 | 001 | G1 |
| ⋮ | ⋮ | ⋮ |

DECODING METHOD, MEMORY CONTROLLING CIRCUIT UNIT AND MEMORY STORAGE DEVICE

CROSS-REFERENCE TO RELATED APPLICATION

This application claims the priority benefit of Taiwan application serial no. 107146953, filed on Dec. 25, 2018. The entirety of the above-mentioned patent application is hereby incorporated by reference herein and made a part of this specification.

BACKGROUND

Technical Field

The disclosure relates to a decoding method, a memory controlling circuit unit, and a memory storage device.

Description of Related Art

As digital cameras, mobile phones and MP3 players have grown rapidly in recent years, the consumers' demand for storage media has also increased rapidly. Since a rewritable non-volatile memory module (e.g. a flash memory) has the characteristics of data non-volatility, power saving, small size, and having no mechanical structure, it is very suitable for being built in a variety of portable multimedia devices as exemplified above.

In general, when a read voltage is used to read data from the rewritable non-volatile memory module, the memory management circuit can decode the read data to obtain the data one intends to read. However, when the decoding fails, the memory management circuit executes a retry-read mechanism to re-obtain another read voltage and uses this read voltage to read to re-obtain the read data and decodes it. The memory management circuit executes the above-described decoding operation according to the re-obtained verification bit to obtain another piece of decoded data composed of a plurality of decoded bits. The above-described retry-read mechanism by re-obtaining the read voltage can be repeatedly executed until the number of times exceeds a predetermined number of times. When the retry-read mechanism is executed until the number of times exceeds the predetermined number of times, the memory management circuit can execute the decoding operation by using methods other than the retry-read mechanism, for example.

In particular, when a decoding operation is executed on a piece of data, the decoding operation may have to be executed for a plurality of times (for example, when the retry-read mechanism is executed until the number of times exceeds the predetermined number of times) to determine whether the decoding has succeeded or failed. Therefore, how to reduce the execution time of decoding is one of the problems that persons skilled in the art intend to solve.

SUMMARY

Technical Problem

Therefore, the disclosure provides a decoding method, a memory controlling circuit unit, and a memory storage device, which can effectively reduce the execution time of the decoding operation and improve the success probability of decoding.

The disclosure provides a decoding method for a rewritable non-volatile memory module, the rewritable non-volatile memory module having a plurality of physical erasing units, each of the plurality of physical erasing units having a plurality of physical programming units, the decoding method including: receiving a read command for reading first data; obtaining a current first temperature of the rewritable non-volatile memory module according to the read command; obtaining a second temperature of the rewritable non-volatile memory module of writing the first data to a first physical programming unit of a first physical erasing unit among the plurality of physical erasing units according to the read command; and selecting a first decoding operation according to the first temperature and the second temperature and executing the first decoding operation.

The disclosure provides a memory controlling circuit unit for a rewritable non-volatile memory module, the rewritable non-volatile memory module having a plurality of physical erasing units, each of the plurality of physical erasing units having a plurality of physical programming units, the memory controlling circuit unit including a host interface, a memory interface and a memory management circuit. The host interface is coupled to a host system. The memory interface is coupled to the rewritable non-volatile memory module. The memory management circuit is coupled to the host interface and the memory interface. The memory management circuit is configured to execute the following steps: receiving a read command for reading first data; obtaining a current first temperature of the rewritable non-volatile memory module according to the read command; obtaining a second temperature of the rewritable non-volatile memory module of writing the first data to a first physical programming unit of a first physical erasing unit among the plurality of physical erasing units according to the read command; and selecting a first decoding operation according to the first temperature and the second temperature and executing the first decoding operation.

The disclosure provides a memory storage device, including a connection interface unit, a rewritable non-volatile memory module and a memory controlling circuit unit. The connection interface unit is coupled to a host system. The rewritable non-volatile memory module has a plurality of physical erasing units, each of the plurality of physical erasing units having a plurality of physical programming units. The memory controlling circuit unit is coupled to the connection interface unit and the rewritable non-volatile memory module. The memory controlling circuit unit is configured to execute the following steps: receiving a read command for reading first data; obtaining a current first temperature of the rewritable non-volatile memory module according to the read command; obtaining a second temperature of the rewritable non-volatile memory module of writing the first data to a first physical programming unit of a first physical erasing unit among the plurality of physical erasing units according to the read command; and selecting a first decoding operation according to the first temperature and the second temperature and executing the first decoding operation.

The disclosure provides a decoding method for a rewritable non-volatile memory module, the rewritable non-volatile memory module having a plurality of physical erasing units, each of the plurality of physical erasing units having a plurality of physical programming units, the decoding method including: receiving a read command for reading first data; obtaining a current first temperature of the rewritable non-volatile memory module according to the read command; obtaining a second temperature of the rewritable non-volatile memory module of writing the first data to a first physical erasing unit among the plurality of physical erasing units according to the read command; selecting a first decoding operation according to the first temperature and the second temperature and executing the first decoding operation; determining whether a difference between the first temperature and the second temperature is greater than a second threshold value when it is determined that the number of uncorrectable error bits in the first physical erasing unit is greater than a first threshold value according to an execution result of the first decoding operation; determining that the first physical erasing unit is a damaged physical erasing unit when the difference is not greater than the second threshold value; and determining that the first physical erasing unit is not a damaged physical erasing unit when the difference is greater than the second threshold value.

Based on the above, the disclosure provides the decoding method, the memory controlling circuit unit and the memory storage device, which can, according to the write temperature and the read temperature of a piece of data in the rewritable non-volatile memory module, select the decoding operation suitable for the write temperature and the read temperature to decode the piece of data, thereby effectively reducing the execution time of the decoding operation and improving the success probability of decoding.

In order to make the aforementioned features and advantages of the disclosure comprehensible, embodiments accompanied with drawings are described in detail below.

BRIEF DESCRIPTION OF THE DRAWINGS

FIG. 10 is a schematic diagram of an example of a physical erasing unit according to the present exemplary embodiment.

FIG. 14 is a schematic diagram of a first lookup table according to an exemplary embodiment.

FIG. 15 is a schematic diagram of the first identification code replicas according to an exemplary embodiment.

FIG. 16 is a schematic diagram of selecting a first decoding operation according to a first identification code and a second identification code according to an exemplary embodiment.

DESCRIPTION OF THE EMBODIMENTS

In general, a memory storage device (also referred to as a memory storage system) includes a rewritable non-volatile memory module and a controller (also referred to as a controlling circuit). Typically, the memory storage device is used together with a host system to enable the host system to write data to or read data from the memory storage device.

Figure 1:
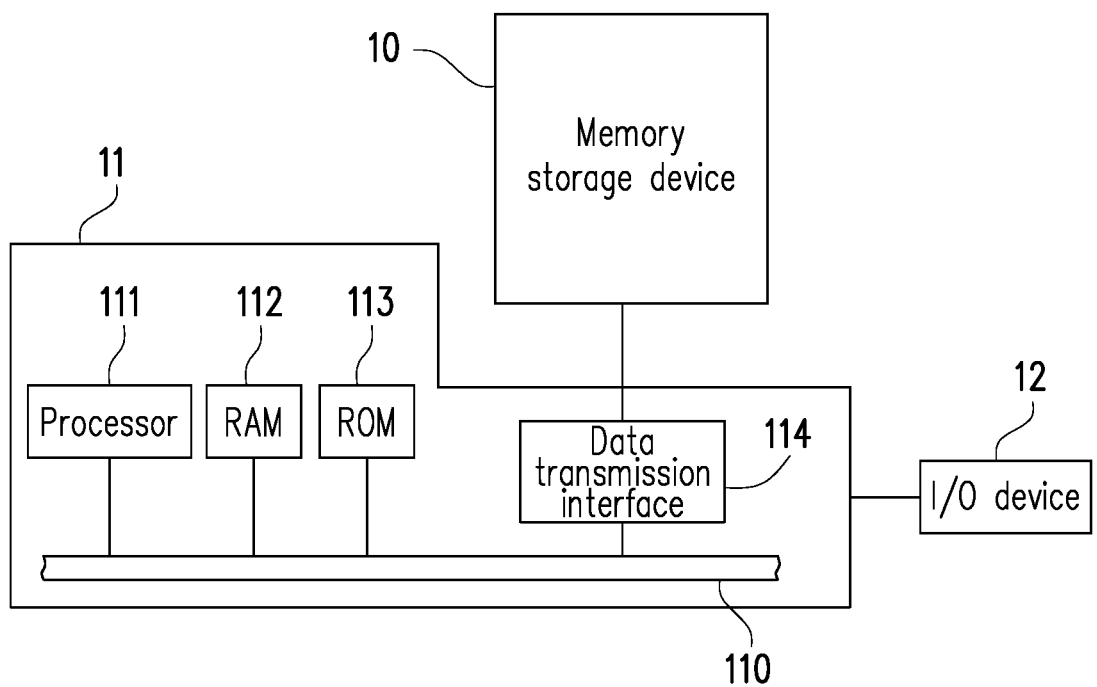
FIG. 1 is a schematic diagram of a host system, a memory storage device, and an input/output (I/O) device according to an exemplary embodiment of the disclosure.
Figure 2:
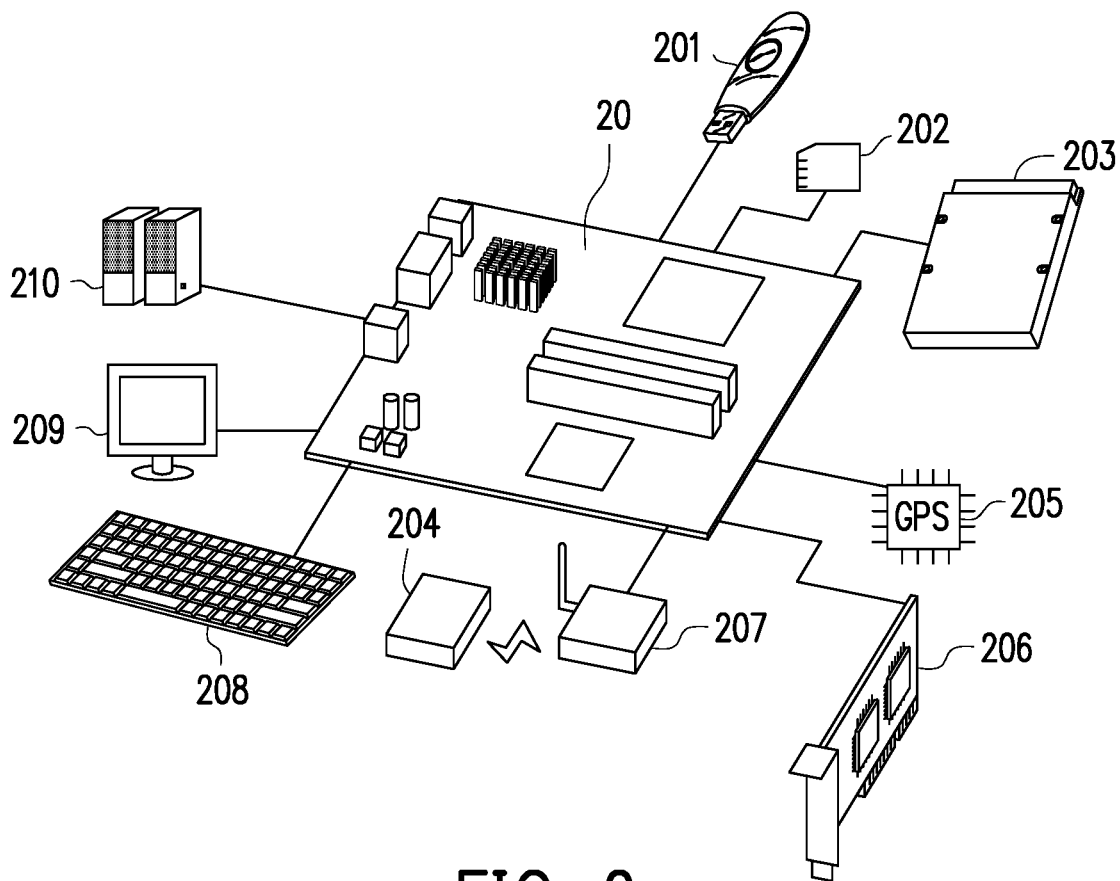
FIG. 2 is a schematic diagram of a host system, a memory storage device, and an I/O device according to another exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to another exemplary embodiment of the disclosure.

With reference to FIGS. 1 and 2, a host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the present exemplary embodiment, the host system 11 is coupled to a memory storage device 10 via the data transmission interface 114. For example, the host system 11 may store data to or read data from the memory storage device 10 via the data transmission interface 114. In addition, the host system 11 is coupled to an I/O device 12 via the system bus 110. For example, the host system 11 may transmit output signals to or receive input signals from the I/O device 12 via the system bus 110.

In the present exemplary embodiment, the processor 111, the random access memory 112, the read only memory 113, and the data transmission interface 114 may be disposed on a motherboard 20 of the host system 11. The number of the data transmission interface 114 may be one or a plurality. The motherboard 20 may be coupled to the memory storage device 10 via the data transmission interface 114 through a wired or wireless connection. The memory storage device 10 may be, for example, a flash drive 201, a memory card 202, a solid state drive (SSD) 203, or a wireless memory storage device 204. The wireless memory storage device 204 may be a memory storage device based on various wireless communication technologies, such as a near field communication (NFC) memory storage device, a wireless fax (WiFi) memory storage device, a Bluetooth memory storage device, a low power Bluetooth memory storage device (e.g. iBeacon), etc. In addition, the motherboard 20 may also be coupled to various I/O devices, such as a global positioning system (GPS) module 205, a network interface card 206, a wireless transmission device 207, a keyboard 208, a screen 209, a speaker 210, etc., via the system bus 110. For example, in an exemplary embodiment, the motherboard 20 may access the wireless memory storage device 204 via the wireless transmission device 207.

Figure 3:
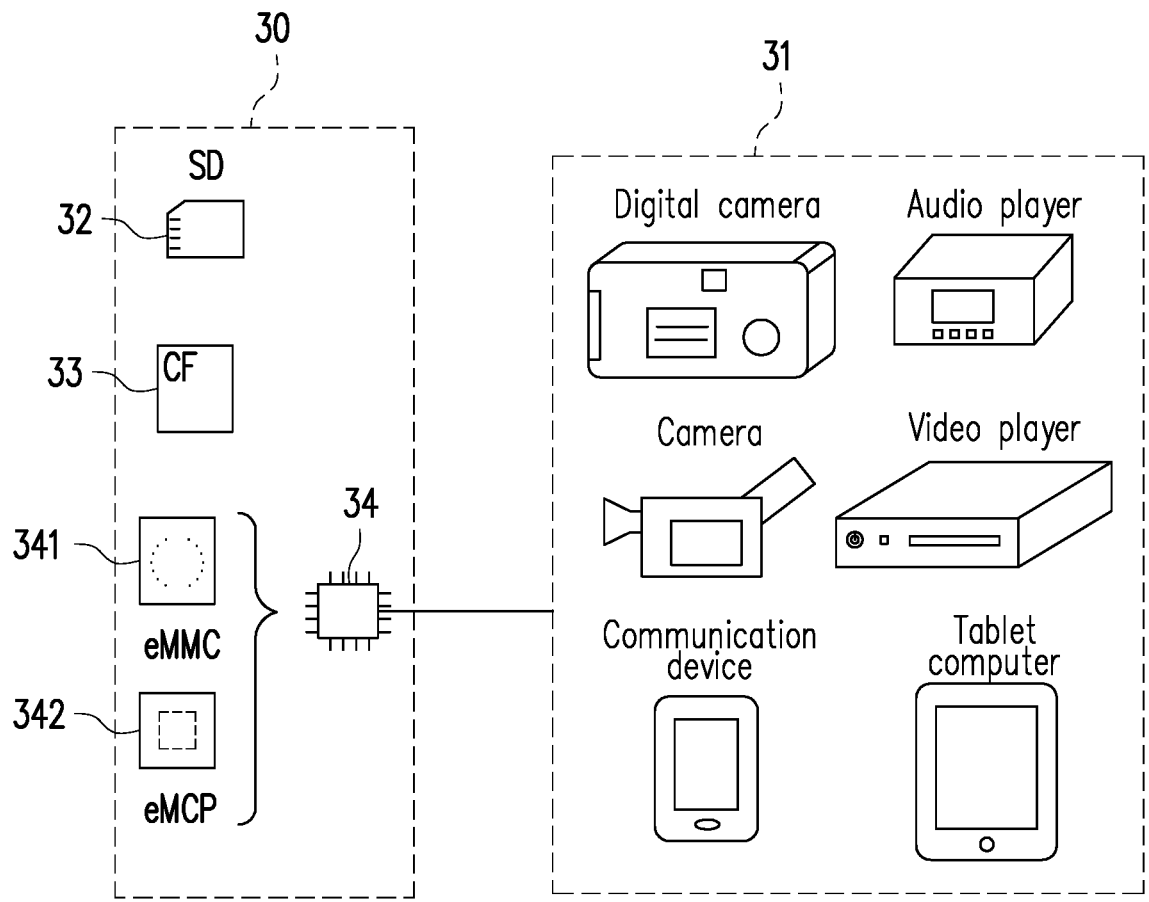
FIG. 3 is a schematic diagram of a host system and a memory storage device according to another exemplary embodiment of the disclosure.

In an exemplary embodiment, the above-mentioned host system is any system that can substantially cooperate with a memory storage device to store data. In the above exemplary embodiment, the host system is illustrated by a computer system; however, FIG. 3 is a schematic diagram of a host system and a memory storage device according to another exemplary embodiment of the disclosure. With reference to FIG. 3, in another exemplary embodiment, a host system 31 may be a system, such as a digital camera, a camera, a communication device, an audio player, a video player, a tablet computer, etc.; and a memory storage device 30 may be various non-volatile memory storage devices, such as an SD card 32, a CF card 33, an embedded storage device 34, etc., used in the host system 31. The embedded storage device 34 includes various embedded storage devices that directly couple a memory module to a substrate of the host system, such as an embedded multimedia card (embedded MMC, eMMC) 341 and/or an embedded multi-chip package (eMCP) 342, etc.

Figure 4:
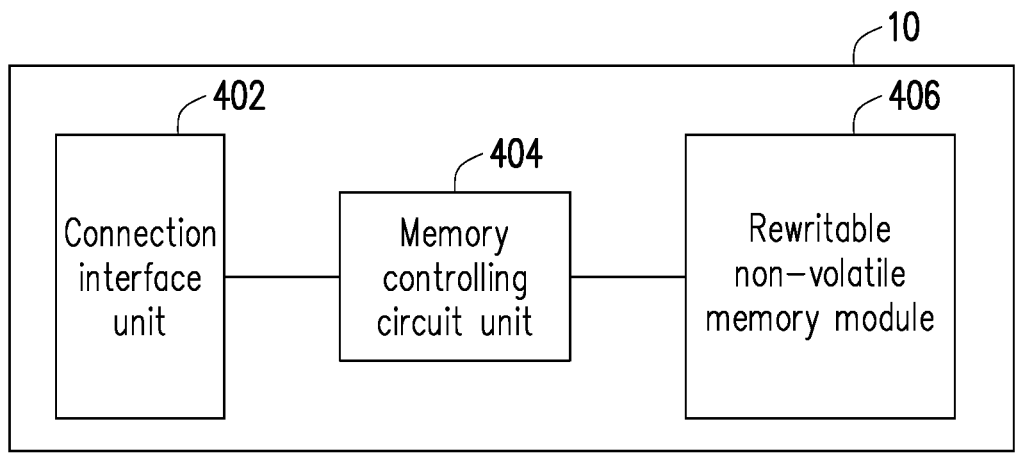
FIG. 4 is a schematic block diagram of a memory storage device according to an exemplary embodiment of the disclosure.

FIG. 4 is a schematic block diagram of a memory storage device according to an exemplary embodiment of the disclosure.

With reference to FIG. 4, the memory storage device 10 includes a connection interface unit 402, a memory controlling circuit unit 404, and a rewritable non-volatile memory module 406.

In the present exemplary embodiment, the connection interface unit 402 is compatible with the Serial Advanced Technology Attachment (SATA) standard. However, it should be understood that the disclosure is not limited thereto, and the connection interface unit 402 may also be compliant with the Parallel Advanced Technology Attachment (PATA) standard, the Institute of Electrical and Electronic Engineers (IEEE) 1394 Standard, the Peripheral Component Interconnect Express (PCI Express) standard, the Universal Serial Bus (USB) standard, the Secure Digital (SD) interface standard, the Ultra High Speed-I (UHS-I) interface standard, the Ultra High Speed-II (UHS-II) interface standard, the Memory Stick (MS) interface standard, the Multi-Chip Package interface standard, the Multimedia Card (MMC) interface standard, the Embedded Multimedia Card (eMMC) interface standard, the Universal Flash Storage (UFS) interface standard, the embedded multi-chip package (eMCP) interface standard, the compact flash (CF) interface standard, the Integrated Device Electronics (IDE) standard or other suitable standards. The connection interface unit 402 may be packaged in a chip with the memory controlling circuit unit 404, or the connection interface unit 402 may be disposed outside a chip including the memory controlling circuit unit 404.

The memory controlling circuit unit 404 is configured to execute a plurality of logic gates or control commands implemented in a hardware form or a firmware form and to perform operations such as writing, reading and erasing of data in the rewritable non-volatile memory module 406 according to the commands of the host system 11.

The rewritable non-volatile memory module 406 is coupled to the memory controlling circuit unit 404 and is configured to store data written by the host system 11. The rewritable non-volatile memory module 406 may be a Single-Level-Cell (SLC) NAND flash memory module (i.e., a flash memory module that can store 1 bit in a memory cell), a Multi-Level-Cell (MLC) NAND flash memory module (i.e., a flash memory module that can store 2 bits in a memory cell), a Triple-Level-Cell (TLC) NAND flash memory module (i.e., a flash memory module that can store 3 bits in a memory cell), other flash memory modules, or other memory modules with the same characteristics.

The memory cells in the rewritable non-volatile memory module 406 are arranged in an array. The memory cell array will be described below in a two-dimensional array. However, it should be noted here that the following exemplary embodiment is only one example of the memory cell array. In other exemplary embodiments, the arrangement of the memory cell array can be adjusted to meet practical requirements.

Figure 5:
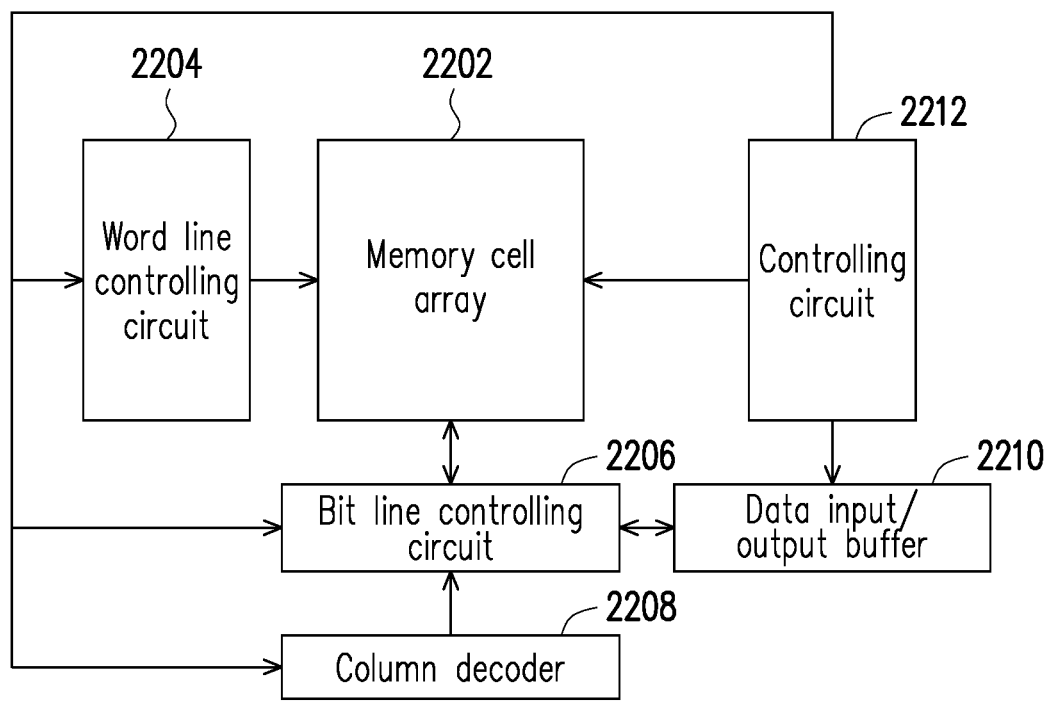
FIG. 5 is a schematic block diagram of a rewritable non-volatile memory module according to an exemplary embodiment.
Figure 6:
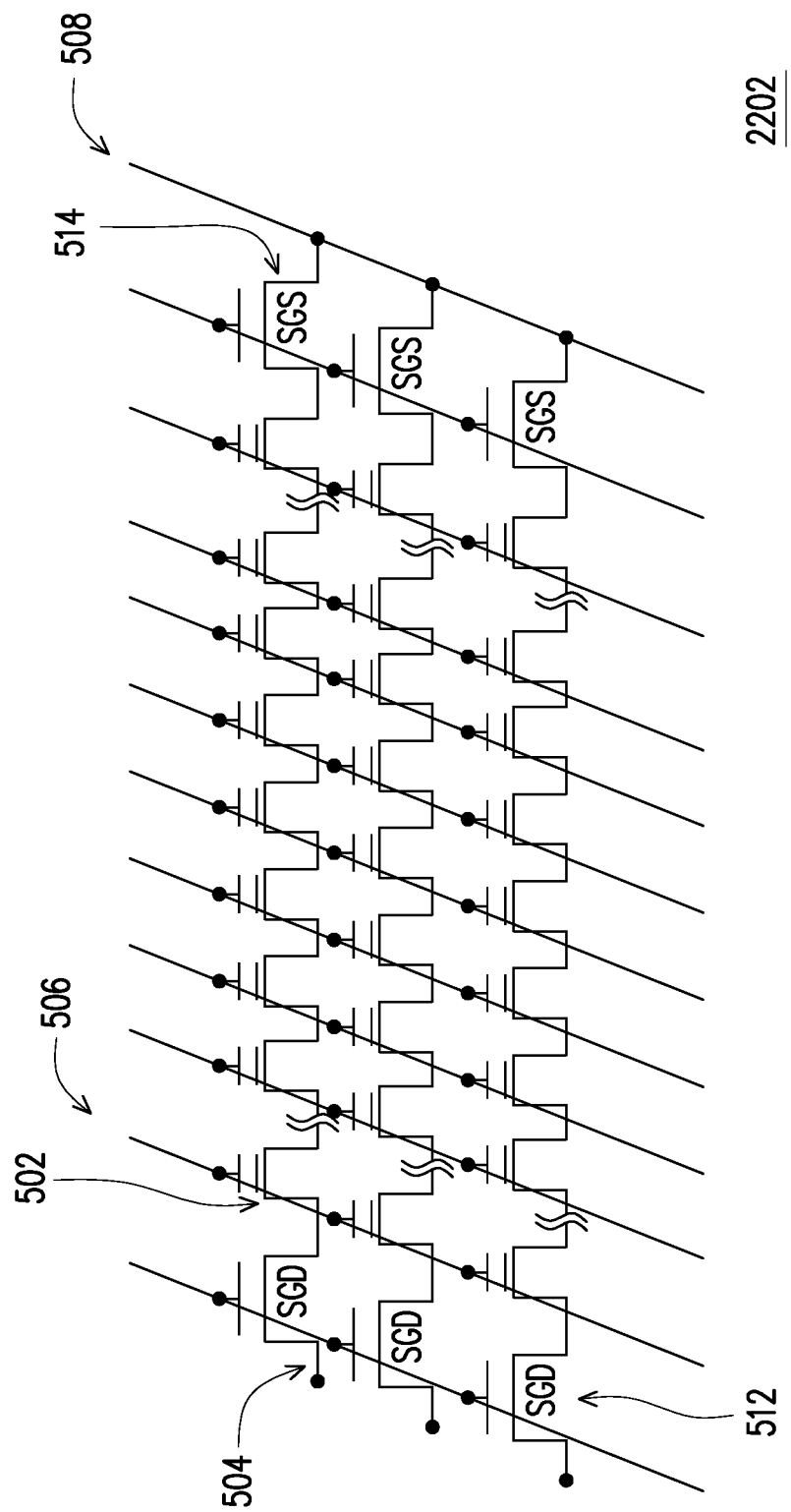
FIG. 6 is a schematic diagram of a memory cell array according to an exemplary embodiment.

FIG. 5 is a schematic block diagram of a rewritable non-volatile memory module according to an exemplary embodiment. FIG. 6 is a schematic diagram of a memory cell array according to an exemplary embodiment.

With reference to FIGS. 5 and 6 together, the rewritable non-volatile memory module 406 includes a memory cell array 2202, a word line controlling circuit 2204, a bit line controlling circuit 2206, a column decoder 2208, a data input/output buffer 2210 and a controlling circuit 2212.

In the present exemplary embodiment, the memory cell array 2202 may include a plurality of memory cells 502, a plurality of select gate drain (SGD) transistors 512, and a plurality of select gate source (SGS) transistors 514 for storing data; and a plurality of bit lines 504, a plurality of word lines 506, and a common source line 508 for connecting the memory cells (as shown in FIG. 6). The memory cells 502 are arranged in an array (or in a three-dimensionally stacked way) at intersections of the bit lines 504 and the word lines 506. When receiving a write command or a read command from the memory controlling circuit unit 404, the controlling circuit 2212 controls the word line controlling circuit 2204, the bit line controlling circuit 2206, the column decoder 2208, and the data input/output buffer 2210 to write data to or read data from the memory cell array 2202, wherein the word line controlling circuit 2204 is configured to control the voltage applied to the word lines 506, the bit line controlling circuit 2206 is configured to control the voltage applied to the bit lines 504, the column decoder 2208 selects a corresponding bit line according to a row address in the command, and the data input/output buffer 2210 is configured to temporarily store the data.

The memory cells in the rewritable non-volatile memory module 406 store a plurality of bits by a change in a threshold voltage. Specifically, there is a charge trapping layer between a control gate and a channel of each memory cell. By applying a write voltage to the control gate, the electron amount of the charge trapping layer can be changed, thereby changing the threshold voltage of the memory cell. This procedure of changing the threshold voltage is also referred to as "writing data to the memory cell" or "programming the memory cell". As the threshold voltage changes, each memory cell of the memory cell array 2202 has a plurality of storage states. And by reading the voltage, it can be determined which storage state the memory cell belongs to, thereby obtaining the bit stored by the memory cell.

Figure 7:
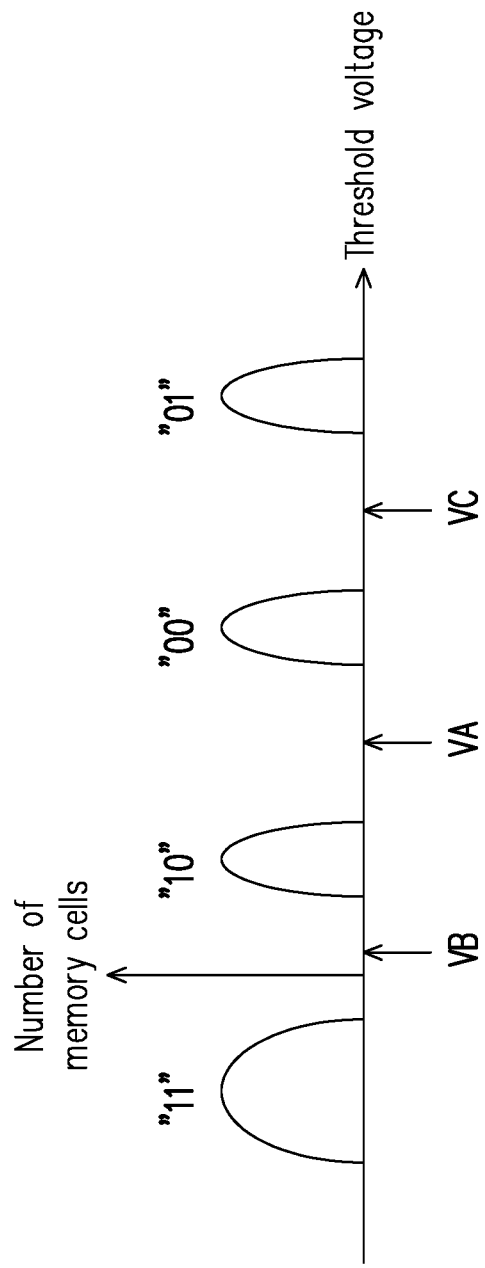
FIG. 7 is a diagram showing a statistical distribution of gate voltages corresponding to write data stored in the memory cell array according to an exemplary embodiment.

FIG. 7 is a diagram showing a statistical distribution of gate voltages corresponding to write data stored in the memory cell array according to an exemplary embodiment.

With reference to FIG. 7, taking the MLC NAND flash memory as an example, each memory cell has 4 storage states with different threshold voltages, and the storage states respectively represent bits of "11", "10", "00" and "01". In other words, each storage state includes a least significant bit (LSB) and a most significant bit (MSB). In the present exemplary embodiment, the first bit from the left side in the storage state (i.e., "11", "10", "00" and "01") is the LSB, and the second bit from the left side is the MSB. Thus, in the present exemplary embodiment, each memory cell can store 2 bits. It should be understood that the correspondence between the threshold voltage and its storage state shown in FIG. 7 is only an example. In another exemplary embodiment of the disclosure, the correspondence between the threshold voltage and the storage state may be arranged as "11", "10", "01" and "00" as the threshold voltage increases or may be arranged in other ways. In addition, in another exemplary embodiment, the first bit from the left side may be defined as the MSB, and the second bit from the left side may be defined as the LSB.

In an exemplary embodiment in which a memory cell can store a plurality of bits (e.g. an MLC or TLC NAND flash memory module), a physical programming unit belonging to the same word line can be classified as at least a lower physical programming unit and an upper physical programming unit. For example, in an MLC NAND flash memory module, the least significant bit (LSB) of a memory cell belongs to a lower physical programming unit, and the most significant bit (MSB) of the memory cell belongs to an upper physical programming unit. In an exemplary embodiment, the lower physical programming unit is also referred to as a fast page, and the upper physical programming unit is also referred to as a slow page. In addition, in the TLC NAND flash memory module, the least significant bit (LSB) of a memory cell belongs to a lower physical programming unit, and the center significant bit (CSB) of the memory cell belongs to a middle physical programming unit, and the most significant bit (MSB) of the memory cell belongs to an upper physical programming unit.

Figure 8:
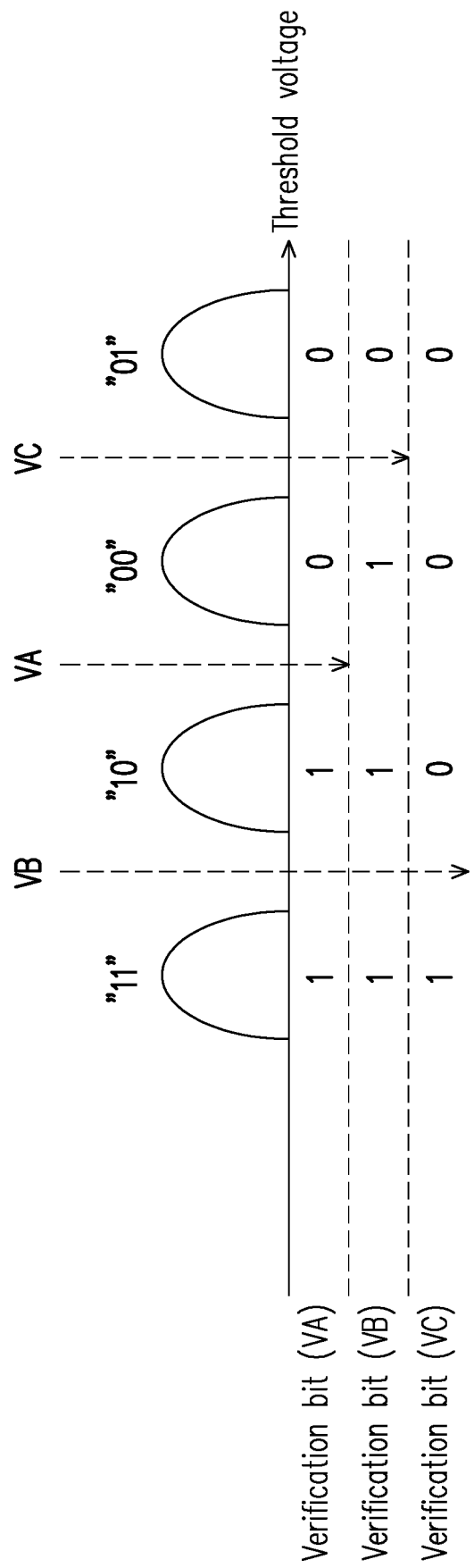
FIG. 8 is a schematic diagram of reading data from a memory cell according to an exemplary embodiment.

FIG. 8 is a schematic diagram of reading data from a memory cell according to an exemplary embodiment, which takes an MLC NAND flash memory as an example.

With reference to FIG. 8, a reading operation of the memory cell of the memory cell array 2202 is performed by applying read voltages VA to VC to the control gate and identifying the data stored in the memory cell through the conduction state of the memory cell channel. A verification bit (VA) is configured to indicate whether the memory cell channel is turned on when the read voltage VA is applied; a verification bit (VC) is configured to indicate whether the memory cell channel is turned on when the read voltage VC is applied; a verification bit (VB) is configured to indicate whether the memory cell channel is turned on when the read voltage VB is applied. It is assumed here that when the verification bit is "1", the corresponding memory cell channel is turned on, and when the verification bit is "0", the corresponding memory cell channel is not turned on. As shown in FIG. 8, the verification bits (VA) to (VC) can be used to determine which storage state the memory cell is in, and thereby the stored bit can be obtained.

Figure 9:
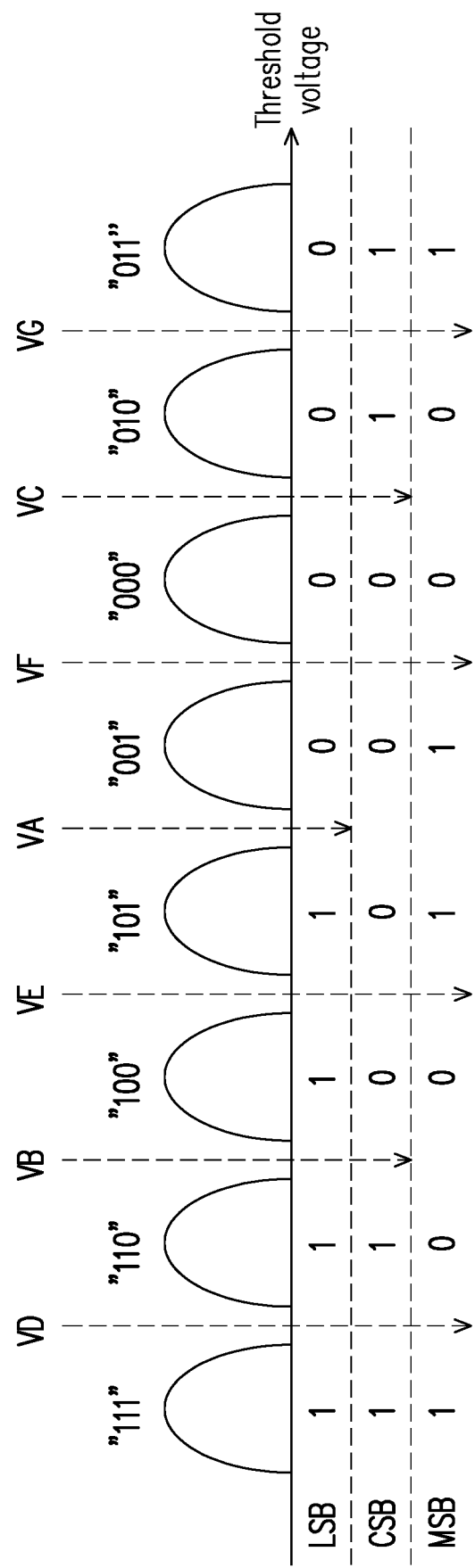
FIG. 9 is a schematic diagram of reading data from a memory cell according to another exemplary embodiment.

FIG. 9 is a schematic diagram of reading data from a memory cell according to another exemplary embodiment.

With reference to FIG. 9, taking a TLC NAND flash memory as an example, each storage state includes a least significant bit LSB, which is the first bit from the left side; a center significant bit CSB, which is the second bit from the left side; and a most significant bit MSB, which is the third bit from the left side. In this example, a memory cell has 8 storage states (i.e., "111", "110", "100", "101", "001", "000", "010" and "011") according to different threshold voltages. The bits stored by the memory cells can be identified by applying the read voltages VA to VG to the control gates.

In addition, the order of the 8 storage states of FIG. 9 may be arranged according to the manufacturer's design and is not limited to the arrangement of the present example.

Further, the memory cells of the rewritable non-volatile memory module 406 configure a plurality of physical programming units, and the physical programming units configure a plurality of physical erasing units. Specifically, the memory cells on the same word line in FIG. 6 form one or a plurality of physical programming units. For example, if the rewritable non-volatile memory module 406 is an MLC NAND flash memory module, the memory cells on the intersections of the same word line and the plurality of bit lines configure two physical programming units, i.e. an upper physical programming unit and a lower physical programming unit. And an upper physical programming unit and a lower physical programming unit may be collectively referred to as a physical programming unit group. In particular, if the data to be read is in a lower physical programming unit of a physical programming unit group, the read voltage VA as shown in FIG. 8 may be used to identify the value of each bit in the lower physical programming unit. If the data to be read is in an upper physical programming unit of a physical programming unit group, the read voltage VB and the read voltage VC as shown in FIG. 8 may be used to identify the value of each bit in the upper physical programming unit.

Alternatively, if the rewritable non-volatile memory module 406 is a TLC NAND flash memory module, the memory cells on the intersections of the same word line and the plurality of bit lines configure three physical programming units, i.e. an upper physical programming unit, a middle physical programming unit, and a lower physical programming unit. And an upper physical programming unit, a middle physical programming unit, and a lower physical programming unit may be collectively referred to as a physical programming unit group. In particular, if the data to be read is in a lower physical programming unit of a physical programming unit group, the read voltage VA as shown in FIG. 9 may be used to identify the value of each bit in the lower physical programming unit. If the data to be read is in a middle physical programming unit of a physical programming unit group, the read voltage VB and the read voltage VC as shown in FIG. 9 may be used to identify the value of each bit in the middle physical programming unit. If the data to be read is in an upper physical programming unit of a physical programming unit group, the read voltage VD, the read voltage VE, the read voltage VF, and the read voltage VG as shown in FIG. 9 may be used to identify the value of each bit in the upper physical programming unit.

In the present exemplary embodiment, the physical programming unit is the minimum unit for programming. That is, the physical programming unit is the minimum unit for writing data. The physical programming unit is, for example, a physical page or a physical sector. If the physical programming unit is a physical page, then the physical programming units typically include data bit areas and redundancy bit areas. The data bit area includes a plurality of physical sectors for storing user data, and the redundancy bit area is configured to store system data (e.g. error correction codes). In the present exemplary embodiment, the data bit area includes 32 physical sectors, and the size of a physical sector is 512 bytes (B). However, in other exemplary embodiments, the data bit area may include 8, 16, or a greater or lesser number of physical sectors, and the size of each of the physical sectors may also be larger or smaller. On the other hand, a physical erasing unit is the minimum unit for erasing. That is, each physical erasing unit contains the smallest number of memory cells to be erased together. The physical erasing unit is, for example, a physical block.

FIG. 10 is a schematic diagram of an example of a physical erasing unit according to the present exemplary embodiment.

With reference to FIG. 10, in the present exemplary embodiment, it is assumed that a physical erasing unit is composed of a plurality of physical programming unit groups, wherein each of the physical programming unit groups includes a lower physical programming unit, a middle physical programming unit and an upper physical programming unit composed of a plurality of memory cells arranged on the same word line. For example, in the physical erasing unit, the $0^{th}$ physical programming unit belonging to the lower physical programming unit, the $1^{st}$ physical programming unit belonging to the middle physical programming unit, and the $2^{nd}$ physical programming unit belonging to the upper physical programming unit are viewed as one physical programming unit group. Similarly, the $3^{rd}$, $4^{th}$, and $5^{th}$ physical programming units are viewed as one physical programming unit group, and similarly, other physical programming units are also divided into a plurality of physical programming unit groups in this way.

Figure 11:
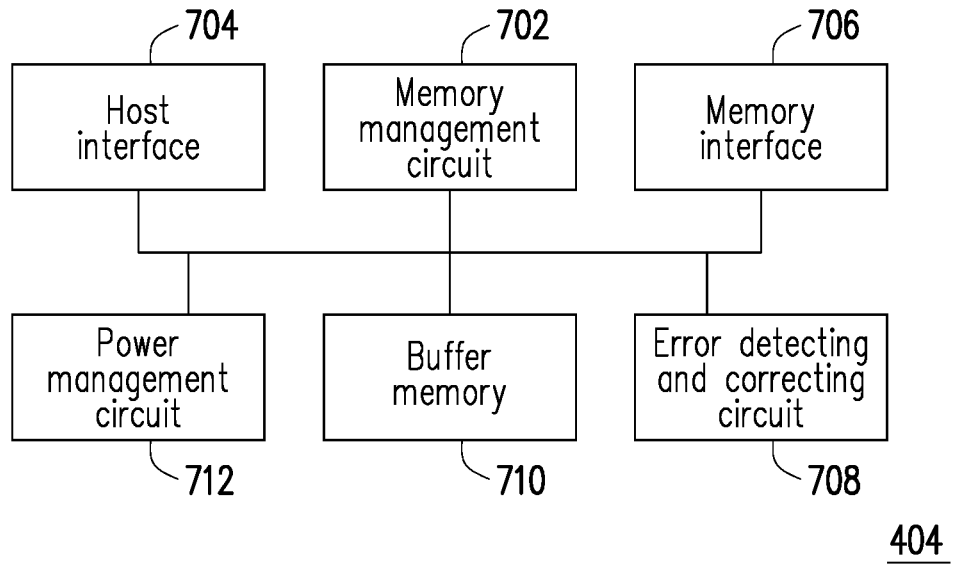
FIG. 11 is a schematic block diagram of a memory controlling circuit unit according to an exemplary embodiment of the disclosure.

FIG. 11 is a schematic block diagram of a memory controlling circuit unit according to an exemplary embodiment of the disclosure.

With reference to FIG. 11, the memory controlling circuit unit 404 includes a memory management circuit 702, a host interface 704, a memory interface 706, and an error detecting and correcting circuit 708.

The memory management circuit 702 is configured to control the overall operation of the memory controlling circuit unit 404. Specifically, the memory management circuit 702 has a plurality of control commands, and when the memory storage device 10 operates, the plurality of control commands are executed to perform operations such as writing, reading and erasing of data. When the operation of the memory management circuit 702 or the operation of any circuit element included in the memory controlling circuit unit 404 is described below, it is equivalent to describing the operation of the memory controlling circuit unit 404.

In the present exemplary embodiment, the control commands of the memory management circuit 702 are implemented in a firmware form. For example, the memory management circuit 702 has a microprocessor unit (not shown) and a read only memory (not shown), and the control commands are programmed into the read only memory. When the memory storage device 10 operates, the control commands are executed by the microprocessor unit to perform operations such as writing, reading, and erasing of data.

In another exemplary embodiment, the control commands of the memory management circuit 702 may be stored in a specific area of the rewritable non-volatile memory module 406 (e.g. a system area dedicated to storing system data in the memory module) in a program code form. In addition, the memory management circuit 702 has a microprocessor unit (not shown), a read only memory (not shown), and a random access memory (not shown). In particular, the read only memory has a boot code, and when the memory controlling circuit unit 404 is enabled, the microprocessor unit first executes the boot code to load the control commands stored in the rewritable non-volatile memory module 406 into the random access memory of the memory management circuit 702. Thereafter, the microprocessor unit will run these control commands to perform operations such as writing, reading and erasing of data.

In addition, in another exemplary embodiment, the control commands of the memory management circuit 702 may be implemented in a hardware form. For example, the memory management circuit 702 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage the memory cells of the rewritable non-volatile memory module 406 or a group thereof. The memory writing circuit is configured to issue a write command sequence to the rewritable non-volatile memory module 406 to write data to the rewritable non-volatile memory module 406. The memory reading circuit is configured to issue a read command sequence to the rewritable non-volatile memory module 406 to read data from the rewritable non-volatile memory module 406. The memory erasing circuit is configured to issue an erase command sequence to the rewritable non-volatile memory module 406 to erase data from the rewritable non-volatile memory module 406. The data processing circuit is configured to process the data to be written to the rewritable non-volatile memory module 406 and the data read from the rewritable non-volatile memory module 406. The write command sequence, the read command sequence, and the erase command sequence may each include one or a plurality of program codes or command codes for instructing the rewritable non-volatile memory module 406 to execute corresponding operations of writing, reading and erasing. In an exemplary embodiment, the memory management circuit 702 may also issue other types of command sequences to the rewritable non-volatile memory module 406 to instruct the rewritable non-volatile memory module 406 to execute corresponding operations.

The host interface 704 is coupled to the memory management circuit 702 and configured to receive and identify the commands and data transmitted from the host system 11. In other words, the commands and data transmitted from the host system 11 are transmitted to the memory management circuit 702 via the host interface 704. In the present exemplary embodiment, the host interface 704 is compatible with the SATA standard. However, it should be understood that the disclosure is not limited thereto, and the host interface 704 may be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 706 is coupled to the memory management circuit 702 and is configured to access the rewritable non-volatile memory module 406. In other words, the data to be written to the rewritable non-volatile memory module 406 is converted to a format acceptable to the rewritable non-volatile memory module 406 via the memory interface 706. Specifically, if the memory management circuit 702 is to access the rewritable non-volatile memory module 406, the memory interface 706 will transmit corresponding command sequences. For example, the command sequences may include a write command sequence to instruct data writing, a read command sequence to instruct data reading, an erase command sequence to instruct data erasing, and corresponding command sequences for instructing various memory operations (e.g. changing the read voltage level, executing a garbage collection procedure, etc.). These command sequences are generated, for example, by the memory management circuit 702 and transmitted to the rewritable non-volatile memory module 406 via the memory interface 706. The command sequences may include one or a plurality signals or data on the bus. The signals or data may include command codes or program codes. For example, the read command sequence includes information such as the read identification code, the memory address, etc.

The error detecting and correcting circuit 708 is coupled to the memory management circuit 702 and is configured to execute an error detecting and correcting procedure to ensure the correctness of the data. Specifically, when the memory management circuit 702 receives a write command from the host system 11, the error detecting and correcting circuit 708 generates a corresponding error correcting code (ECC) and/or error detecting code (EDC) for the data corresponding to the write command, and the memory management circuit 702 writes the data corresponding to the write command and the corresponding error correcting code and/or error detecting code to the rewritable non-volatile memory module 406. Thereafter, when the memory management circuit 702 reads the data from the rewritable non-volatile memory module 406, it reads the error correcting code and/or the error detecting code corresponding to the data simultaneously, and the error detecting and correcting circuit 708 executes the error detecting and correcting procedure on the read data based on the error correcting code and/or error detecting code.

In an exemplary embodiment, the memory controlling circuit unit 404 further includes a buffer memory 710 and a power management circuit 712.

The buffer memory 710 is coupled to the memory management circuit 702 and is configured to temporarily store data and commands from the host system 11 or data from the rewritable non-volatile memory module 406. The power management circuit 712 is coupled to the memory management circuit 702 and is configured to control the power of the memory storage device 10.

It is noted that in the following description, some terms may be replaced with corresponding abbreviations for ease of reading (see Table 1).

TABLE 1

| rewritable non-volatile memory module | RNVM module |
|---|---|
| physical programming unit | PPU |
| physical erasing unit | PEU |
| memory management circuit | MMC |

Figure 12:
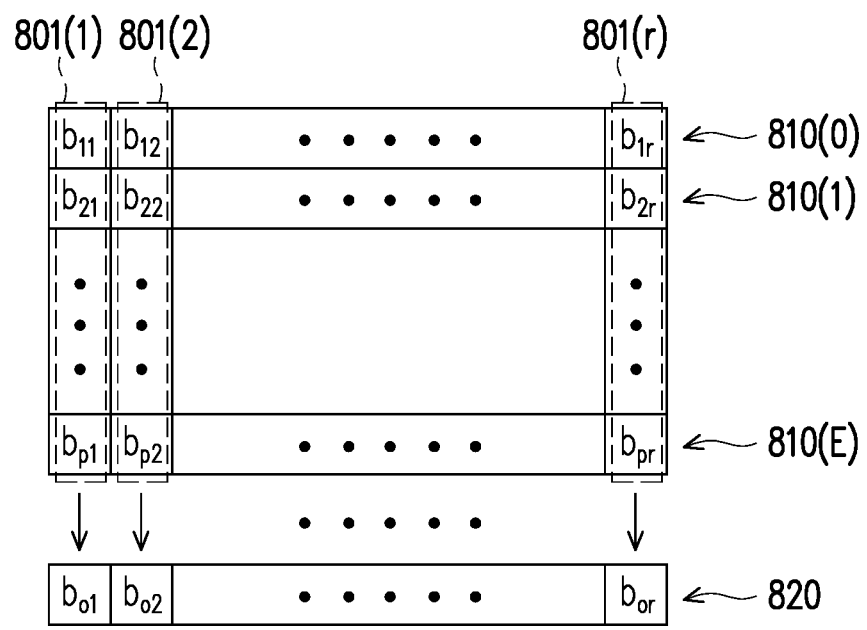
FIG. 12 is a schematic diagram of multi-frame encoding according to an exemplary embodiment of the disclosure.

In the present exemplary embodiment, the error detecting and correcting circuit 708 may perform single-frame encoding on data stored in the same PPU and may perform multi-frame encoding on data stored in a plurality of PPUs. The single-frame encoding and the multi-frame encoding may respectively employ at least one of encoding algorithms such as low density parity code (LDPC), BCH code, convolutional code, turbo code, etc. Alternatively, in an exemplary embodiment, the multi-frame encoding may employ Reed-solomon codes (RS codes) algorithm or an XOR algorithm. In addition, in another exemplary embodiment, more encoding algorithms not listed above may also be employed, and details are not described herein. Depending on the encoding algorithm employed, the error detecting and correcting circuit 708 can encode the data to be protected to generate a corresponding error correcting code and/or error detecting code. For ease of description, the error correcting code and/or error detecting code generated via encoding will be collectively referred to as encoded data hereinafter. FIG. 12 is a schematic diagram of multi-frame encoding according to an exemplary embodiment of the disclosure.

With reference to FIG. 12, taking the corresponding encoded data 820 generated by encoding the data stored in the PPUs 810(0) to 810(E) as an example, at least part of the data stored in each of the PPUs 810(0) to 810(E) may be viewed as a frame. In multi-frame encoding, the data in the PPUs 810(0) to 810(E) is encoded based on the location of each bit (or byte). For example, bits $b_{11}$, $b_{21}$, . . . , $b_{p1}$ at a location 801(1) are encoded as a bit $b_{o1}$ in the encoded data 820, and bits $b_{12}$, $b_{22}$, . . . , $b_{p2}$ at a location 801(2) are encoded as a bit $b_{o2}$ in the encoded data 820; likewise, bits $b_{1r}$, $b_{2r}$, . . . , $b_{pr}$ located at a location 801(r) are encoded as a bit $b_{or}$ in the encoded data 820. Thereafter, the data read from the PPUs 810(0) to 810(E) can be decoded based on the encoded data 820 to try to correct errors that may exist in the read data.

In addition, in another exemplary embodiment of FIG. 12, the data used to generate the encoded data 820 may also include the redundancy bits corresponding to the data bits in the data stored in the PPUs 810(0) to 810(E). Taking the data stored in the PPU 810(0) as an example, the redundancy bits are generated, for example, by single-frame encoding the data bits stored in the PPU 810(0). In the present exemplary embodiment, it is assumed that when the data is read from the PPU 810(0), the data read from the PPU 810(0) may be first decoded by using the redundancy bits (e.g. the encoded data by single-frame encoding) in the PPU 810(0) for error detection and correction. However, when decoding using the redundancy bits in the PPU 810(0) fails (for example, the number of error bits in the data stored in the PPU 810(0) after decoding is greater than a threshold value), a retry-read mechanism may be used to try to read the correct data from the PPU 810(0). The details of the retry-read mechanism will be described later. When the correct data cannot be read from the PPU 810(0) by the retry-read mechanism, the encoded data 820 and the data in the PPUs 810(1) to 810(E) may be read and decoded based on the encoded data 820 and the data of the PPUs 810(1) to 810(E) to try to correct errors existing in the data stored in the PPU 810(0). In other words, in the present exemplary embodiment, when decoding by using the encoded data generated by the single-frame encoding fails and when reading by using the retry-read mechanism fails, the encoded data generated by the multi-frame encoding is used for decoding instead.

Figure 13:
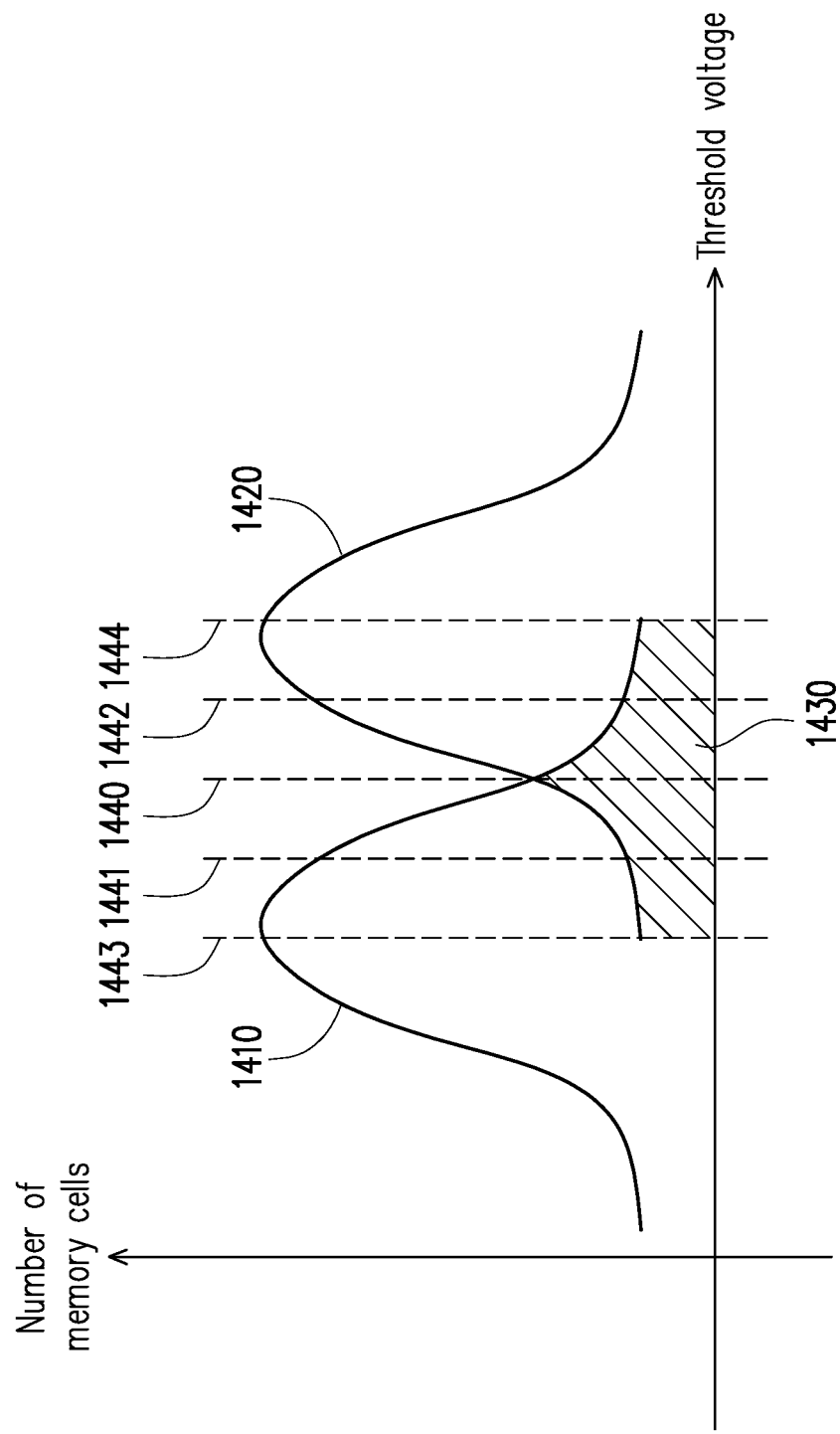
FIG. 13 is a schematic diagram of a retry-read mechanism according to an exemplary embodiment.

In particular, FIG. 13 is a schematic diagram of a retry-read mechanism according to an exemplary embodiment.

With reference to FIG. 13, taking an SLC flash memory as an example here, a distribution 1410 and a distribution 1420 are used to indicate the storage states of a plurality of first memory cells, and the distributions 1410 and 1420 respectively represent different storage states. The first memory cells may belong to the same PPU or different PPUs, and the disclosure is not limited thereto. It is assumed here that when a memory cell belongs to the distribution 1410, the memory cell stores the bit "1"; when the memory cell belongs to the distribution 1420, the memory cell stores the bit "0". When the MMC 702 reads the memory cell with a read voltage 1440, the MMC 702 obtains a verification bit which is configured to indicate whether the memory cell is turned on. It is assumed here that the verification bit is "1" when the memory cell is turned on and "0" when the memory cell is not turned on, but the disclosure is not limited thereto. The MMC 702 determines that the memory cell belongs to the distribution 1410 if the verification bit is "1" and determines that the memory cell belongs to the distribution 1420 in the other case. However, the distribution 1410 and the distribution 1420 overlap in an area 1430. That is, there are several memory cells that belong to the distribution 1410 but are identified as belonging to the distribution 1420, and there are several memory cells that belong to the distribution 1420 but are identified as belonging to the distribution 1410.

In the present exemplary embodiment, when the memory cells are to be read, the MMC 702 first selects a predetermined read voltage (e.g. a read voltage 1441) to read the memory cells to obtain the verification bits of these memory cells. The error detecting and correcting circuit 708 executes a decoding operation based on the verification bits of the memory cells to generate a plurality of decoded bits, and the decoded bits may form a piece of decoded data (also referred to as a codeword).

If the decoding fails, it means that these memory cells store uncorrectable error bits. If the decoding fails, in the retry-read mechanism, the MMC 702 re-obtains another read voltage and uses this read voltage (e.g. a read voltage 1442) to read the first memory cells to re-obtain the verification bits of the memory cells. The MMC 702 executes the above-described decoding operation according to the re-obtained verification bits to obtain another piece of decoded data formed by a plurality of decoded bits. In an exemplary embodiment, the error detecting and correcting circuit 708 determines whether the another piece of decoded data is a valid codeword according to a syndrome corresponding to the another piece of decoded data. If the another piece of decoded data is not a valid codeword, the MMC 702 determines that the decoding has failed. If the number of times of re-obtaining the read voltage does not exceed a predetermined number of times, the MMC 702 re-obtains another obtaining voltage (e.g. a read voltage 1443) and reads the memory cells according to the re-obtained read voltage 1443 to re-obtain the verification bits and execute the first decoding operation.

In other words, when there are uncorrectable error bits, the verification bits of some of the memory cells will be changed by re-obtaining the read voltage, whereby there is a chance to change the decoding result of the decoding operation. Logically, the above operation of re-obtaining the read voltage is to flip a number of bits in a codeword and re-decode the new codeword. In some cases, codewords that cannot be decoded before the flip (with uncorrectable error bits) may be decoded after the flip. Also, in an exemplary embodiment, the MMC 702 tries to decode for a number of times until the number of trials exceeds a predetermined number of times. However, the disclosure does not limit the number of the predetermined number of times.

It should be noted that the decoding operation executed by using the encoded data generated by the single-frame encoding can be divided into hard bit mode decoding and soft bit mode decoding. During both the hard bit mode decoding and the soft bit mode decoding, decoding has to performed according to the "decoding initial value" of the memory cell. During the hard bit mode decoding, the decoding initial value of the memory cell is divided into two values (e.g. n and −n) according to one verification bit. For example, the MMC 702 sets the decoding initial value of the corresponding memory cell to be −n if the verification bit is "1" and sets the decoding initial value to n if the verification bit is "0", where n is a positive number; however, the disclosure does not limit the value of the positive integer n. That is, iterative decoding executed according to two types of values is also referred to as hard bit mode decoding. However, the above step of changing the read voltage may also be applied to soft bit mode decoding, wherein the decoding initial value of each memory cell is determined according to a plurality of verification bits. In addition, since the probability value of the bit is calculated in the iterative decoding in both the hard bit mode and the soft bit mode, both modes are probability decoding algorithms. The detailed execution processes of the hard bit mode decoding and the soft bit mode decoding can be known from the prior art, and the details are not described herein.

Though FIG. 13 takes the SLC flash memory as an example, the step of re-obtaining the read voltage may also be applied to an MLC or TLC flash memory. As shown in FIG. 8, changing the read voltage VA flips the LSB of a memory cell, and changing the read voltage VB or the read voltage VC can flip the MSB of a memory cell. Therefore, changing the read voltage VA, VB or VC can change one codeword to another codeword. The result of changing the codeword also applies to the TLC flash memory of FIG. 9. The disclosure does not limit the memory used to being an SLC, MLC or TLC flash memory.

By the above retry-read mechanism, an optimal read voltage for reading a plurality of memory cells located on the same word line can be found, and the optimal read voltage can be used to read the data of the plurality of memory cells and decode the data successfully. In other embodiments, the optimal read voltage can also be used to have the least number of error bits after reading the data of the plurality of memory cells and executing hard bit mode decoding. In particular, the optimal read voltage typically allows the number of the memory cells belonging to the distribution 1410 but identified as belonging to the distribution 1420 to be equal to the number of the memory cells belonging to the distribution 1420 but identified as belonging to the distribution 1410, as shown in FIG. 13, and this optimal read voltage is, for example, the read voltage 1440 in FIG. 13. The operation of finding the optimal read voltage for reading the memory cells may also be referred to as an "optimal read voltage search operation", which may be executed when the RNVM module 406 is idle (or referred to as the background time), may be executed after the hard bit mode decoding fails, or may be obtained during the execution of the hard bit mode decoding (i.e., the read voltage with the least number of error bits), and the determined optimal read voltage may be used for subsequent reading of the RNVM module 406.

It should be noted that, in the present embodiment, when a PPU in the RNVM module 406 is to be read, the MMC 702 first uses a predetermined voltage to read the PPU and executes hard bit mode decoding based on the data read by using the predetermined voltage. When a decoding failure occurs during the hard bit mode decoding, the above-mentioned retry-read mechanism is executed to execute the hard bit mode decoding again. When a retry-read mechanism fails when performing the reading, the soft bit mode decoding is executed. During the execution of the soft bit mode decoding, the optimal read voltage search operation is first executed to find the optimal read voltage for reading a memory cell of the PPU; the optimal read voltage is used as an initial read voltage, and the PPU is read based on the initial read voltage to execute the soft bit mode decoding. When the decoding operation executed according to the data read by using the initial read voltage fails, the MMC 702 reads the memory cell using a plurality of read voltages including the adjacent locations of the initial read voltage and executes the decoding operation. When the soft bit mode decoding fails (for example, a plurality of read voltages including the adjacent locations of the initial read voltage are used to read the memory cell, and the decoding operations are executed and all fail), the MMC 702 uses the encoded data generated by the multi-frame encoding for decoding instead.

In light of the above, when the decoding operation is executed on a piece of data, the decoding operation may have to be executed for a plurality of times (e.g. the hard bit mode decoding, the soft bit mode decoding, the optimal read voltage search operation, or the decoding operation executed according to the encoded data generated by the multi-frame encoding) to determine whether the decoding has succeeded or failed. Therefore, the disclosure provides a decoding method that can calculate, according to the temperature (also referred to as a write temperature) of the RNVM module 406 of writing a piece of data and the temperature (also referred to as a read temperature) of the RNVM module 406 when the piece of data is read therefrom, the temperature difference between the write temperature and the read temperature to select the decoding operation suitable for this temperature difference for execution, thereby effectively reducing the execution time of the decoding operation and improving the success probability of decoding. Detailed embodiments are described below.

FIG. 14 is a schematic diagram of a first lookup table according to an exemplary embodiment.

With reference to FIG. 14, in the present embodiment, the MMC 702 stores a lookup table 140 (also referred to as the first lookup table). The lookup table 140 records a plurality of temperature intervals and a plurality of identification codes respectively corresponding to the temperature intervals. In more detail, the lookup table 140 records a temperature interval A0 below −25° C. and indicates the temperature interval A0 with an identification code "000". The lookup table 140 records a temperature interval A1 between −25° C. and 0° C. and indicates the temperature interval A1 with an identification code "001". The lookup table 140 records a temperature interval A2 between 0° C. and 25° C. and indicates the temperature interval A2 with an identification code "010". The lookup table 140 records a temperature interval A3 between 25° C. and 40° C. and indicates the temperature interval A3 with an identification code "011". The lookup table 140 records a temperature interval A4 between 40° C. and 60° C. and indicates the temperature interval A4 with an identification code "100". The lookup table 140 records a temperature interval A5 between 60° C. and 80° C. and indicates the temperature interval A5 with an identification code "101". The lookup table 140 records a temperature interval A6 between 80° C. and 100° C. and indicates the temperature interval A6 with an identification code "110". The lookup table 140 records a temperature interval A7 above 100° C. and indicates the temperature interval A7 with an identification code "111".

Thereafter, when the MMC 702 receives a write command from the host system 11 instructing to write a piece of data (also referred to as first data), the MMC 702 writes the first data to a certain PPU (also referred to as a first PPU) in the RNVM module 406 according to the write command. In particular, the MMC 702 can sense the temperature (also referred to as a second temperature) of the RNVM module 406 during writing of the first data through a temperature sensor (not shown). It is assumed here that the second temperature is 15° C. The MMC 702 can determine that the second temperature is in the temperature interval A2 (also referred to as a first temperature interval), so the MMC 702 can obtain the identification code "010" (also referred to as a first identification code) representing the temperature interval A2.

Thereafter, the MMC 702 writes temperature data corresponding to the second temperature to the RNVM module 406. In more detail, in the present embodiment, the MMC 702 copies the above-described first identification code to generate a plurality of replicas (also referred to as first identification code replicas) and writes the first identification code replicas to the RNVM module 406. It should be noted that although the temperature information is stored in the RNVM module 406 in the form of the first identification code replicas in the present embodiment, in other embodiments, the MMC 702 may store the temperature data corresponding to the second temperature in the RNVM module 406 in other forms (or formats).

Taking an example in which the temperature information is stored in the RNVM module 406 in the form of the first identification code replicas, FIG. 15 is a schematic diagram of the first identification code replicas according to an exemplary embodiment.

With reference to FIG. 15, the MMC 702, for example, copies the identification code "010" to generate five replicas B0 to B4 (i.e., the first identification code replicas) to record the second temperature of writing the first data. In particular, bit errors may be caused during the writing (or reading) of data. Therefore, as shown by the replicas B2 to B3, the identification codes recorded by the replicas B2 to B3 are not the above-described identification code "010". However, by using the first identification code replicas, the decoding time for reading the stored second temperature can be reduced. In more detail, when reading the replicas B0 to B4, the MMC 702 can determine that the number of replicas whose identification code is "010" (i.e., three) is greater than the number of replicas whose identification code is not "010" (i.e., two), and the MMC 702 can quickly obtain the identification code "010" and learn that the second temperature of the RNVM module 406 during the writing of the first data is in the temperature interval A2. In particular, through this determination method, it is possible to quickly learn in which temperature interval the second temperature is located without executing the decoding operation as described above (e.g., the hard bit mode decoding, the retry-read mechanism, the soft bit mode decoding, the decoding operation executed according to the data read by the optimal read voltage, and the decoding operation executed according to the encoded data generated by the multi-frame encoding).

Thereafter, it is assumed that the MMC 702 receives a read command for reading the first data from the host system 11. The MMC 702 can obtain the current temperature (also referred to as a first temperature) of the RNVM module 406 through the temperature sensor according to the read command. It is assumed that the first temperature is −28° C. The MMC 702 can determine that the first temperature is in the temperature interval A0 (also referred to as a second temperature interval) according to the lookup table 140, so the MMC 702 can obtain the identification code "000" (also referred to as a second identification code) representing the temperature interval A0.

Thereafter, the MMC 702 further reads the replicas B0 to B4 as shown in FIG. 15 according to the above-mentioned read command. The MMC 702 learns that the second temperature of the RNVM module 406 of writing the first data to the first PPU is in the interval A2 represented by the identification code "010" according to at least one of the replicas B0 to B4 (e.g., the replicas B0 to B1 and the replica B4).

Thereafter, the MMC 702 selects, according to the above-mentioned identification code "010" and identification code "000", the decoding operation (also referred to as a first decoding operation) suitable for the temperature difference between the temperature intervals represented by the identification code "010" and the identification code "000" from a plurality of decoding operations and outputs the decoded data after executing the first decoding operation.

For example, FIG. 16 is a schematic diagram of selecting the first decoding operation according to the first identification code and the second identification code according to an exemplary embodiment.

With reference to FIG. 16, for ease of description, hereinafter, the temperature of the RNVM module 406 when data is written thereto will be referred to as the "write temperature", and the temperature of the RNVM module 406 when data is read therefrom will be referred to as the "read temperature". Taking the retry-read mechanism as an example, a plurality of read voltage groups (e.g. read voltage groups G0 to GN (not shown)) may be stored in advance to allow the MMC 702 to select when executing the retry-read mechanism. The manufacturer of the memory storage device 10 may find the applicable read voltage group G0 when the write temperature is in the temperature interval A0 represented by the identification code "000" and the read temperature is in the temperature interval A0 represented by the identification code "000" through experiments and then record this correspondence in a lookup table 160. In other words, when the write temperature is in the temperature interval A0 and the read temperature is in the temperature interval A0, the success probability of decoding will be higher by using the read voltage group G0 to execute the reading operation and executing the decoding operation according to the read data. Similarly, the manufacturer of the memory storage device 10 may find the applicable read voltage group G0 when the write temperature is in the temperature interval A1 represented by the identification code "001" and the read temperature is in the temperature interval A0 represented by the identification code "000" through experiments and then record this correspondence in the lookup table 160. The correspondence between other write temperatures, read temperatures, and read voltage groups in the lookup table 160 can be obtained in the above-described way, and thus descriptions will be omitted here.

Continuing the above example in which the second temperature is 15° C. (i.e., the write temperature is 15° C.) and the first temperature is −28° C. (i.e., the read temperature is −28° C.), the MMC 702 can, according to the identification code "010" of the temperature interval A2 where the second temperature is located and the identification code "000" of the temperature interval A0 where the first temperature is located, select the read voltage group G0 (also referred to as a specific read voltage group) applicable to the temperature difference between the temperature interval A2 and the temperature interval A0 according to the lookup table 160. Then, the MMC 702 can use this read voltage group G0 to read the first PPU to obtain a piece of data (also referred to as second data) and execute the decoding operation (e.g. the hard bit mode decoding) according to the second data. In the present embodiment, the temperature difference between the temperature interval A2 and the temperature interval A0 of the MMC 702 can be viewed as the temperature difference between the first temperature and the second temperature.

However, it should be noted that the above embodiment selects the specific read voltage group based on the temperature difference between the first temperature and the second temperature. In one embodiment, the MMC 702 may select a parameter applicable during the decoding (e.g., an LLR (log-likelihood ratio) value for LDPC decoding) according to the temperature difference between the first temperature and the second temperature. In addition, in one embodiment, the MMC 702 can select an applicable decoding operation from a plurality of decoding operations (e.g. the hard bit mode decoding, the soft bit mode decoding, the optimal read voltage search operation, or the decoding operation executed according to the encoded data generated by the multi-frame encoding) to execute according to the temperature difference between the first temperature and the second temperature. For example, when the temperature difference between the read temperature and the write temperature is less than a third threshold value, the stage of the retry-read mechanism in the hard bit mode decoding may be executed. When the temperature difference between the read temperature and the write temperature is greater than the third threshold value and less than a fourth threshold value, the soft bit mode decoding may be directly entered to execute the stage of executing the optimal read voltage search operation and executing reading and decoding according to the found optimal read voltage. When the temperature difference between the read temperature and the write temperature is greater than the fourth threshold value and less than a fifth threshold value, the stage of executing reading and decoding according to another read voltage (e.g. a voltage having an offset from the optimal read voltage) in the soft bit mode decoding may be directly executed. When the temperature difference between the read temperature and the write temperature is greater than the fifth threshold value and less than a sixth threshold value, the stage of executing the decoding operation according to the encoded data generated by the multi-frame encoding may be directly entered.

In other words, in the present embodiment, the MMC 702 may have at least one decoding operation, such as the first decoding operation (e.g. the hard bit mode decoding) applicable to the first temperature difference and the second decoding operation (e.g., the soft bit mode decoding) applicable to the second temperature difference. The MMC 702 can determine, according to the temperature difference between the read temperature (e.g. the above-described first temperature) and the write temperature (e.g. the above-described second temperature), whether the temperature difference is the first temperature difference belonging to a specific temperature interval or a second temperature difference belonging to another specific temperature interval. When the temperature difference is the first temperature difference, the MMC 702 may select the first decoding operation (e.g. the hard bit mode decoding) and execute the first decoding operation. When the temperature difference is the second temperature difference, the MMC 702 may select the second decoding operation (e.g. the soft bit mode decoding) and execute the second decoding operation.

In particular, in an embodiment of the disclosure, it is also possible to determine whether a PEU is a damaged PEU according to the temperature difference between the write temperature and the read temperature.

Specifically, when the MMC 702 receives the read command for reading the first data in the first PEU from the host system 11, the MMC 702 senses the RNVM module 406 with the temperature sensor to obtain the current first temperature (i.e. the read temperature) of the RNVM module 406 according to the read command. Then, the MMC 702 obtains the second temperature (i.e. the write temperature) of the RNVM module 406 of writing the first data to the first PEU according to the read command through the methods, for example, shown in the above FIGS. 14 and 15. Thereafter, the MMC 702 selects the first decoding operation according to the aforementioned first temperature and the aforementioned second temperature and executes the first decoding operation. The method of selecting the first decoding operation and executing the first decoding operation has been described in detail above and therefore will not be described again. In particular, when the execution of the first decoding operation fails and the temperature difference between the first temperature and the second temperature is greater than a threshold value, the MMC 702 determines that the first PEU is not a damaged PEU.

In more detail, the MMC 702 determines that the first decoding operation has failed when the MMC 702 determines, according to the execution result of the first decoding operation, the number of the uncorrectable error bits in the first PEU is greater than a threshold value (also referred to as a first threshold value). At this time, the MMC 702 determines whether the difference between the first temperature and the second temperature is greater than another threshold value (also referred to as a second threshold value). The MMC 702 determines that the first PEU is a damaged PEU when the difference between the first temperature and the second temperature is not greater than the second threshold value. The MMC 702 determines that the first PEU is not a damaged PEU when the difference between the first temperature and the second temperature is greater than the second threshold value.

In other words, when the temperature difference between the write temperature and the read temperature is greater, it may cause an occurrence of a decoding failure during the execution of the decoding operation. The decoding failure represents that there are error bits in the data executed with the decoding operation and that the number of the error bits is greater than a threshold value. It should be noted that when the number of the error bits in a PEU is too large, it may mean that the PEU has been damaged. However, in the present embodiment, when the temperature difference between the write temperature and the read temperature is large and the number of the error bits in a PEU is excessive, the MMC 702 does not identify the PEU as a damaged PEU. The reason is that these error bits may be caused by the temperature difference between the write temperature and the read temperature. When the temperature difference between the write temperature and the read temperature is small, the number of the error bits in the PEU may become small when the data in the PEU is decoded. Therefore, if the excessive number of the error bits in the PEU is caused by the temperature difference between the read temperature and the write temperature, the MMC 702 does not identify the PEU as a damaged PEU.

Figure 17:
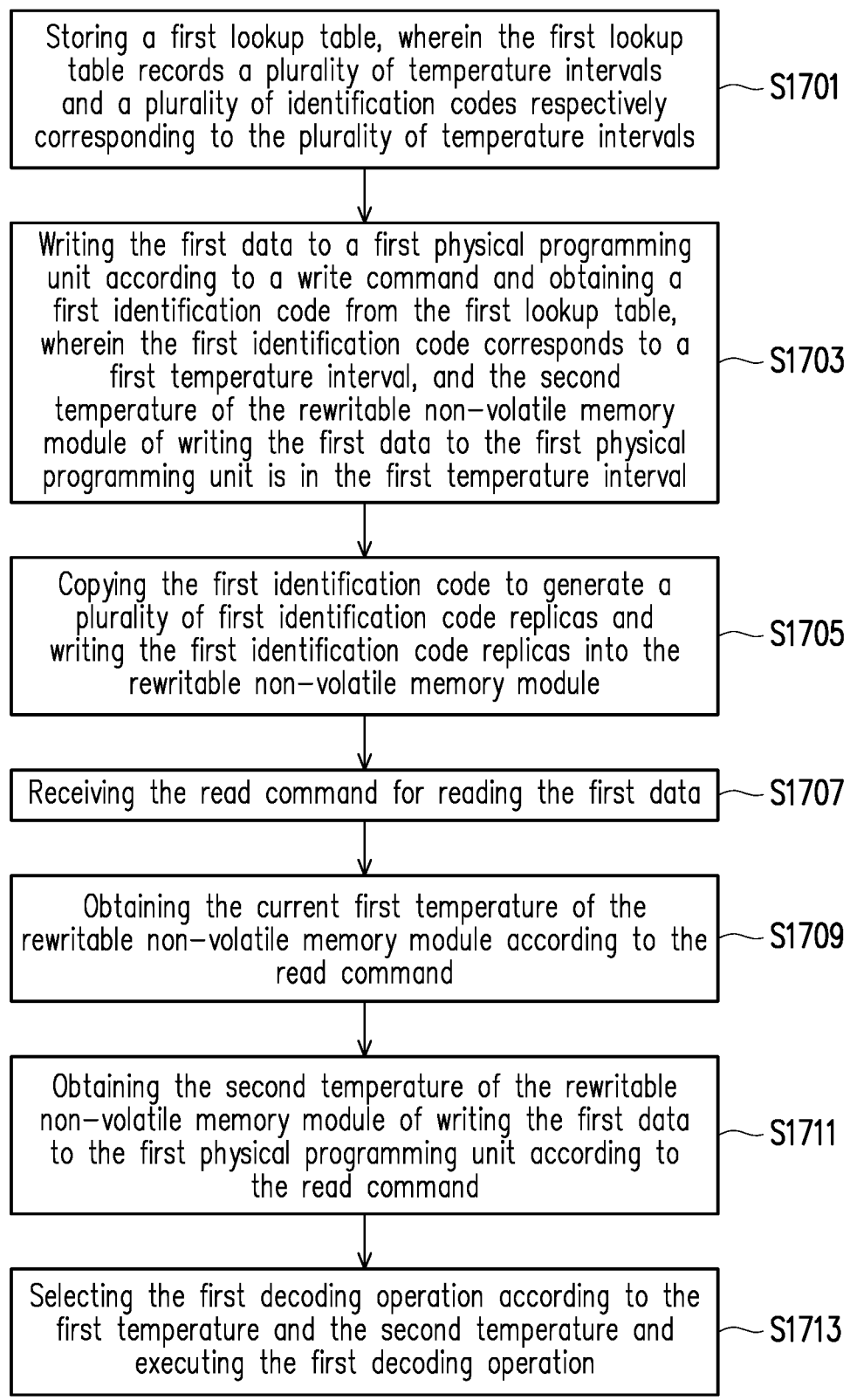
FIG. 17 is a flowchart of a decoding method according to an exemplary embodiment.

FIG. 17 is a flowchart of a decoding method according to an exemplary embodiment.

With reference to FIG. 17, in Step S1701, the MMC 702 stores a first lookup table. The first lookup table records a plurality of temperature intervals and a plurality of identification codes respectively corresponding to the plurality of temperature intervals. In Step S1703, the MMC 702 writes the first data to the first PPU according to the write command and obtains the first identification code from the first lookup table. The first identification code corresponds to the first temperature interval, and the second temperature of the RNVM module 406 of writing the first data to the first PPU is in the first temperature interval. In Step S1705, the MMC 702 copies the first identification code to generate a plurality of first identification code replicas and writes the first identification code replicas into the RNVM module 406. In Step S1707, the MMC 702 receives the read command for reading the first data. In Step S1709, the MMC 702 obtains the current first temperature of the RNVM module 406 either direct or indirect according to the read command. In Step S1711, the MMC 702 obtains the second temperature of the RNVM module 406 of writing the first data to the first PPU either direct or indirect according to the read command. Finally, in Step S1713, the MMC 702 selects the first decoding operation according to the first temperature and the second temperature and executes the first decoding operation.

Figure 18:
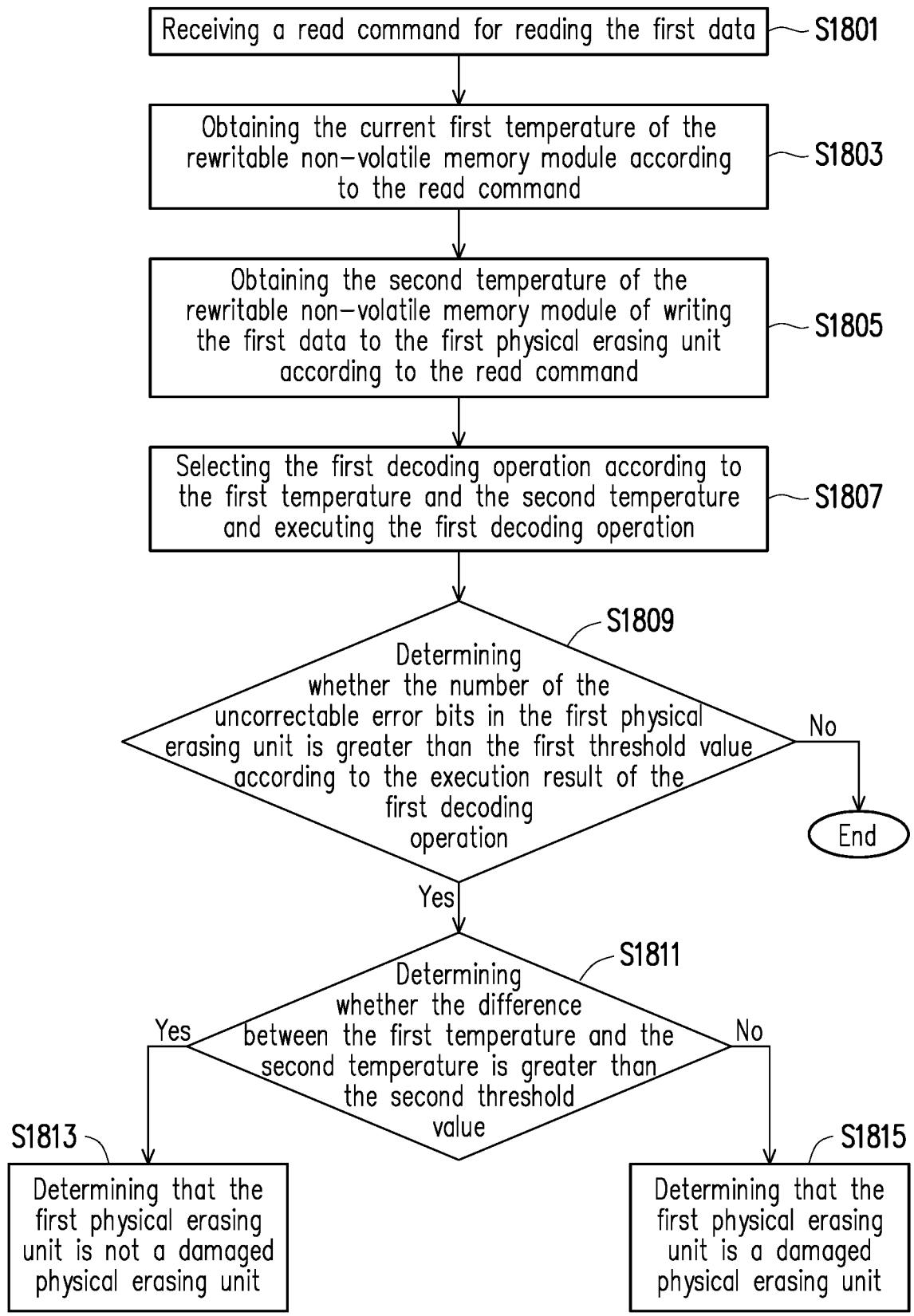
FIG. 18 is a flowchart of a decoding method according to another exemplary embodiment.

FIG. 18 is a flowchart of a decoding method according to another exemplary embodiment.

With reference to FIG. 18, in Step S1801, the MMC 702 receives the read command for reading the first data. In Step S1803, the MMC 702 obtains the current first temperature of the RNVM module 406 either direct or indirect according to the read command. In Step S1805, the MMC 702 obtains the second temperature of the RNVM module 406 of writing the first data to the first PEU according to the read command. In Step S1807, the MMC 702 selects the first decoding operation according to the first temperature and the second temperature and executes the first decoding operation. In Step S1809, the MMC 702 determines whether the number of the uncorrectable error bits in the first PEU is greater than the first threshold value according to the execution result of the first decoding operation. When the number of the uncorrectable error bits in the first PEU is not greater than the first threshold value, the flow of FIG. 18 is ended. When the number of the uncorrectable error bits in the first PEU is greater than the first threshold value, in Step S1811, the MMC 702 determines whether the difference between the first temperature and the second temperature is greater than the second threshold value. When the difference between the first temperature and the second temperature is greater than the second threshold value, in Step S1813, the MMC 702 determines that the first PEU is not a damaged PEU. When the difference between the first temperature and the second temperature is not greater than the second threshold value, in Step S1815, the MMC 702 determines that the first PEU is a damaged PEU.

In summary of the above, the decoding method, the memory controlling circuit unit and the memory storage device of the disclosure can, according to the read temperature and the write temperature of a piece of data in the RNVM module 406, select the decoding operation suitable for the write temperature and the read temperature to decode the piece of data, thereby effectively reducing the execution time of the decoding operation and improving the success probability of decoding.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A decoding method for a rewritable non-volatile memory module, the rewritable non-volatile memory module having a plurality of physical erasing units, each of the plurality of physical erasing units having a plurality of physical programming units, the decoding method comprising:

receiving a read command for reading first data;

obtaining a current first temperature of the rewritable non-volatile memory module according to the read command;

obtaining a second temperature of the rewritable non-volatile memory module of writing the first data to a first physical programming unit of a first physical erasing unit among the plurality of physical erasing units; and selecting a first decoding operation according to the first temperature and the second temperature and executing the first decoding operation.

2. The decoding method according to claim 1, wherein before the step of receiving the read command, the method further comprises:

writing the first data to the first physical programming unit and writing temperature data corresponding to the second temperature to the rewritable non-volatile memory module according to a write command.

3. The decoding method according to claim 1, wherein the rewritable non-volatile memory module has a first lookup table, the first lookup table records a plurality of temperature intervals and a plurality of identification codes respectively corresponding to the plurality of temperature intervals, and before the step of receiving the read command, the decoding method further comprises:

writing the first data to the first physical programming unit according to a write command and obtaining a first identification code among the plurality of identification codes from the first lookup table, wherein the first identification code corresponds to a first temperature interval among the plurality of temperature intervals, and the second temperature is located in the first temperature interval.

4. The decoding method according to claim 3, wherein after the step of obtaining the first identification code among the plurality of identification codes from the first lookup table, the method further comprises:

copying the first identification code to generate a plurality of first identification code replicas and writing the plurality of first identification code replicas to the rewritable non-volatile memory module.

5. The decoding method according to claim 4, wherein the step of obtaining the current first temperature of the rewritable non-volatile memory module comprises:

obtaining a second identification code among the plurality of identification codes from the first lookup table, wherein the second identification code corresponds to a second temperature interval among the plurality of temperature intervals, and the first temperature is located in the second temperature interval.

6. The decoding method according to claim 5, wherein the step of obtaining the second temperature of the rewritable non-volatile memory module of writing the first data to the first physical programming unit comprises:

reading the plurality of first identification code replicas stored in the rewritable non-volatile memory module and obtaining the first identification code according to at least one of the plurality of first identification code replicas.

7. The decoding method according to claim 6, wherein the step of selecting the first decoding operation according to the first temperature and the second temperature comprises:

selecting the first decoding operation according to the first identification code and the second identification code.

8. The decoding method according to claim 1, wherein the step of selecting the first decoding operation and executing the first decoding operation comprises:

selecting a specific read voltage group from a plurality of read voltage groups according to a temperature difference between the first temperature and the second temperature;

using the specific read voltage group to read the first physical programming unit to obtain second data; and executing the first decoding operation according to the second data.

9. The decoding method according to claim 1, wherein the first decoding operation is hard bit mode decoding, soft bit mode decoding, an optimal read voltage search operation, or a decoding operation executed according to encoded data generated by multi-frame encoding.

10. The decoding method according to claim 1, wherein the step of selecting the first decoding operation and executing the first decoding operation comprises:

determining, according to a temperature difference between the first temperature and the second temperature, whether the temperature difference is a first temperature difference or a second temperature difference;

executing the step of selecting the first decoding operation and executing the first decoding operation when the temperature difference is the first temperature difference; and selecting a second decoding operation and executing the second decoding operation when the temperature difference is the second temperature difference, wherein the first decoding operation is different from the second decoding operation.

11. The decoding method according to claim 1, wherein after the step of selecting the first decoding operation and executing the first decoding operation, the method further comprises:

determining that the first physical erasing unit is not a damaged physical erasing unit when execution of the first decoding operation fails and a temperature difference between the first temperature and the second temperature is greater than a threshold value.

12. A memory controlling circuit unit for a rewritable non-volatile memory module, the rewritable non-volatile memory module having a plurality of physical erasing units, each of the plurality of physical erasing units having a plurality of physical programming units, the memory controlling circuit unit comprising:

a host interface coupled to a host system;

a memory interface coupled to the rewritable non-volatile memory module; and a memory management circuit coupled to the host interface and the memory interface, wherein the memory management circuit is configured to receive a read command for reading first data, the memory management circuit is further configured to obtain a current first temperature of the rewritable non-volatile memory module according to the read command, the memory management circuit is further configured to obtain a second temperature of the rewritable non-volatile memory module of writing the first data to a first physical programming unit of a first physical erasing unit among the plurality of physical erasing units, and the memory management circuit is further configured to select a first decoding operation according to the first temperature and the second temperature and executing the first decoding operation.

13. The memory controlling circuit unit according to claim 12, wherein before the operation of receiving the read command,
the memory management circuit is further configured to write the first data to the first physical programming unit and write temperature data corresponding to the second temperature to the rewritable non-volatile memory module according to a write command.

14. The memory controlling circuit unit according to claim 12, wherein the rewritable non-volatile memory module has a first lookup table, the first lookup table records a plurality of temperature intervals and a plurality of identification codes respectively corresponding to the plurality of temperature intervals, and before the operation of receiving the read command,
the memory management circuit is further configured to write the first data to the first physical programming unit according to a write command and obtaining a first identification code among the plurality of identification codes from the first lookup table, wherein the first identification code corresponds to a first temperature interval among the plurality of temperature intervals, and the second temperature is located in the first temperature interval.

15. The memory controlling circuit unit according to claim 14, wherein after the operation of obtaining the first identification code among the plurality of identification codes from the first lookup table,
the memory management circuit is further configured to copy the first identification code to generate a plurality of first identification code replicas and write the plurality of first identification code replicas to the rewritable non-volatile memory module.

16. The memory controlling circuit unit according to claim 15, wherein in the operation of obtaining the current first temperature of the rewritable non-volatile memory module,
the memory management circuit is further configured to obtain a second identification code among the plurality of identification codes from the first lookup table, wherein the second identification code corresponds to a second temperature interval among the plurality of temperature intervals, and the first temperature is located in the second temperature interval.

17. The memory controlling circuit unit according to claim 16, wherein in the operation of obtaining the second temperature of the rewritable non-volatile memory module of writing the first data to the first physical programming unit,
the memory management circuit is further configured to read the plurality of first identification code replicas stored in the rewritable non-volatile memory module and obtain the first identification code according to at least one of the plurality of first identification code replicas.

18. The memory controlling circuit unit according to claim 17, wherein in the operation of selecting the first decoding operation according to the first temperature and the second temperature,
the memory management circuit is further configured to select the first decoding operation according to the first identification code and the second identification code.

19. The memory controlling circuit unit according to claim 12, wherein in the operation of selecting the first decoding operation and executing the first decoding operation, the memory management circuit is further configured to select a specific read voltage group from a plurality of read voltage groups according to a temperature difference between the first temperature and the second temperature,
the memory management circuit is further configured to use the specific read voltage group to read the first physical programming unit to obtain second data, and
the memory management circuit is further configured to execute the first decoding operation according to the second data.

20. The memory controlling circuit unit according to claim 12, wherein the first decoding operation is hard bit mode decoding, soft bit mode decoding, an optimal read voltage search operation, or a decoding operation executed according to encoded data generated by multi-frame encoding.

21. The memory controlling circuit unit according to claim 12, wherein in the operation of selecting the first decoding operation and executing the first decoding operation,
the memory management circuit is further configured to determine, according to a temperature difference between the first temperature and the second temperature, whether the temperature difference is a first temperature difference or a second temperature difference,
the memory management circuit is further configured to execute the operation of selecting the first decoding operation and executing the first decoding operation when the temperature difference is the first temperature difference, and
the memory management circuit is further configured to select a second decoding operation and execute the second decoding operation when the temperature difference is the second temperature difference,
wherein the first decoding operation is different from the second decoding operation.

22. The memory controlling circuit unit according to claim 12, wherein after the operation of selecting the first decoding operation and executing the first decoding operation,
the memory management circuit is further configured to determine that the first physical erasing unit is not a damaged physical erasing unit when execution of the first decoding operation fails and a temperature difference between the first temperature and the second temperature is greater than a threshold value.

23. A memory storage device, comprising:
a connection interface unit coupled to a host system;
a rewritable non-volatile memory module having a plurality of physical erasing units, each of the plurality of physical erasing units having a plurality of physical programming units; and
a memory controlling circuit unit coupled to the connection interface unit and the rewritable non-volatile memory module,
wherein the memory controlling circuit unit is configured to receive a read command for reading first data,
the memory controlling circuit unit is further configured to obtain a current first temperature of the rewritable non-volatile memory module according to the read command,
the memory controlling circuit unit is further configured to obtain a second temperature of the rewritable non-volatile memory module of writing the first data to a first physical programming unit of a first physical erasing unit among the plurality of physical erasing units, and the memory controlling circuit unit is further configured to select a first decoding operation according to the first temperature and the second temperature and executing the first decoding operation.

24. The memory storage device according to claim 23, wherein before the operation of receiving the read command, the memory controlling circuit unit is further configured to write the first data to the first physical programming unit and write temperature data corresponding to the second temperature to the rewritable non-volatile memory module according to a write command.

25. The memory storage device according to claim 23, wherein the rewritable non-volatile memory module has a first lookup table, the first lookup table records a plurality of temperature intervals and a plurality of identification codes respectively corresponding to the plurality of temperature intervals, and before the operation of receiving the read command, the memory controlling circuit unit is further configured to write the first data to the first physical programming unit according to a write command and obtaining a first identification code among the plurality of identification codes from the first lookup table, wherein the first identification code corresponds to a first temperature interval among the plurality of temperature intervals, and the second temperature is located in the first temperature interval.

26. The memory storage device according to claim 25, wherein after the operation of obtaining the first identification code among the plurality of identification codes from the first lookup table, the memory controlling circuit unit is further configured to copy the first identification code to generate a plurality of first identification code replicas and write the plurality of first identification code replicas to the rewritable non-volatile memory module.

27. The memory storage device according to claim 26, wherein in the operation of obtaining the current first temperature of the rewritable non-volatile memory module, the memory controlling circuit unit is further configured to obtain a second identification code among the plurality of identification codes from the first lookup table, wherein the second identification code corresponds to a second temperature interval among the plurality of temperature intervals, and the first temperature is located in the second temperature interval.

28. The memory storage device according to claim 27, wherein in the operation of obtaining the second temperature of the rewritable non-volatile memory module of writing the first data to the first physical programming unit, the memory controlling circuit unit is further configured to read the plurality of first identification code replicas stored in the rewritable non-volatile memory module and obtain the first identification code according to at least one of the plurality of first identification code replicas.

29. The memory storage device according to claim 28, wherein in the operation of selecting the first decoding operation according to the first temperature and the second temperature, the memory controlling circuit unit is further configured to select the first decoding operation according to the first identification code and the second identification code.

30. The memory storage device according to claim 23, wherein in the operation of selecting the first decoding operation and executing the first decoding operation, the memory controlling circuit unit is further configured to select a specific read voltage group from a plurality of read voltage groups according to a temperature difference between the first temperature and the second temperature, the memory controlling circuit unit is further configured to use the specific read voltage group to read the first physical programming unit to obtain second data, and the memory controlling circuit unit is further configured to execute the first decoding operation according to the second data.

31. The memory storage device according to claim 23, wherein the first decoding operation is hard bit mode decoding, soft bit mode decoding, an optimal read voltage search operation, or a decoding operation executed according to encoded data generated by multi-frame encoding.

32. The memory storage device according to claim 23, wherein in the operation of selecting the first decoding operation and executing the first decoding operation, the memory controlling circuit unit is further configured to determine, according to a temperature difference between the first temperature and the second temperature, whether the temperature difference is a first temperature difference or a second temperature difference, the memory controlling circuit unit is further configured to execute the operation of selecting the first decoding operation and executing the first decoding operation when the temperature difference is the first temperature difference, and the memory controlling circuit unit is further configured to select a second decoding operation and execute the second decoding operation when the temperature difference is the second temperature difference, wherein the first decoding operation is different from the second decoding operation.

33. The memory storage device according to claim 23, wherein after the operation of selecting the first decoding operation and executing the first decoding operation, the memory controlling circuit unit is further configured to determine that the first physical erasing unit is not a damaged physical erasing unit when execution of the first decoding operation fails and a temperature difference between the first temperature and the second temperature is greater than a threshold value.

34. A decoding method for a rewritable non-volatile memory module, the rewritable non-volatile memory module having a plurality of physical erasing units, each of the plurality of physical erasing units having a plurality of physical programming units, the decoding method comprising:

receiving a read command for reading first data;

obtaining a current first temperature of the rewritable non-volatile memory module according to the read command;

obtaining a second temperature of the rewritable non-volatile memory module when the first data is written to a first physical erasing unit among the plurality of physical erasing units according to the read command;

selecting a first decoding operation according to the first temperature and the second temperature and executing the first decoding operation;

determining whether a difference between the first temperature and the second temperature is greater than a second threshold value when it is determined that the number of uncorrectable error bits in the first physical erasing unit is greater than a first threshold value according to an execution result of the first decoding operation;

determining that the first physical erasing unit is a damaged physical erasing unit when the difference is not greater than the second threshold value; and determining that the first physical erasing unit is not a damaged physical erasing unit when the difference is greater than the second threshold value.

* * * * *